(12) United States Patent
Kaneko et al.

(10) Patent No.: US 8,755,228 B2
(45) Date of Patent: Jun. 17, 2014

(54) WRITING METHOD OF NONVOLATILE SEMICONDUCTOR MEMORY DEVICE

(71) Applicant: Kabushiki Kaisha Toshiba, Minato-ku (JP)

(72) Inventors: Akio Kaneko, Mie (JP); Wataru Sakamoto, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/760,737

(22) Filed: Feb. 6, 2013

(65) Prior Publication Data

US 2014/0043909 A1   Feb. 13, 2014

Related U.S. Application Data

(60) Provisional application No. 61/681,323, filed on Aug. 9, 2012.

(51) Int. Cl.
 *G11C 16/04* (2006.01)

(52) U.S. Cl.
 USPC .................................................. 365/185.17

(58) Field of Classification Search
 USPC ........................ 365/185.01–185.33
 See application file for complete search history.

(56) References Cited

U.S. PATENT DOCUMENTS

| | | | |
|---|---|---|---|
| 6,011,287 A | 1/2000 | Itoh et al. | |
| 7,005,350 B2 * | 2/2006 | Walker et al. | 438/268 |
| 7,292,476 B2 * | 11/2007 | Goda et al. | 365/185.17 |
| 7,400,532 B2 * | 7/2008 | Aritome | 365/185.17 |
| 7,403,421 B2 * | 7/2008 | Mokhlesi et al. | 365/185.19 |
| 7,450,422 B2 * | 11/2008 | Roohparvar | 365/185.17 |
| 7,489,546 B2 * | 2/2009 | Roohparvar | 365/185.17 |
| 7,505,321 B2 * | 3/2009 | Scheuerlein et al. | 365/185.17 |
| 7,746,700 B2 * | 6/2010 | Roohparvar | 365/185.21 |
| 7,916,545 B2 | 3/2011 | Fujiu | |
| 7,983,086 B2 | 7/2011 | Sato et al. | |
| 8,023,331 B2 | 9/2011 | Fujiu | |
| 8,159,880 B2 | 4/2012 | Sato et al. | |
| 8,184,484 B2 | 5/2012 | Fujiu | |
| 2004/0124466 A1 * | 7/2004 | Walker et al. | 257/344 |
| 2004/0125629 A1 * | 7/2004 | Scheuerlein et al. | 365/17 |

(Continued)

FOREIGN PATENT DOCUMENTS

| | | |
|---|---|---|
| JP | 10-302488 A | 11/1998 |
| JP | 2009-048697 A | 3/2009 |
| JP | 2009-140542 A | 6/2009 |
| JP | 2010-092559 A | 4/2010 |
| JP | 2010-135003 A | 6/2010 |
| JP | 2010-157288 A | 7/2010 |
| JP | 2011-070710 A | 4/2011 |

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, there is provided a writing method. The method includes setting potentials of a plurality of word lines to a first potential. The first potential is a potential to allow memory cells corresponding to a selective bit line to be in on state. The method also includes setting potentials of non-adjacent word lines to a second potential while maintaining potentials of adjacent word lines at a potential which allows the memory cells corresponding to the selective bit line to be in on state and setting a potential of a selective word line to a third potential. The second potential is a potential which is determined so as to allow the memory cells corresponding to the selective bit line to be in off state. The third potential is a potential where data is written in the selective memory cell corresponding to the selective bit line.

20 Claims, 23 Drawing Sheets

(56) References Cited

U.S. PATENT DOCUMENTS

| | | | |
|---|---|---|---|
| 2007/0047314 A1* | 3/2007 | Goda et al. | 365/185.18 |
| 2007/0140012 A1* | 6/2007 | Roohparvar | 365/185.17 |
| 2007/0189073 A1* | 8/2007 | Aritome | 365/185.18 |
| 2007/0236990 A1* | 10/2007 | Aritome | 365/185.01 |
| 2007/0263462 A1* | 11/2007 | Roohparvar | 365/198 |
| 2007/0291542 A1* | 12/2007 | Aritome | 365/185.18 |
| 2008/0031044 A1* | 2/2008 | Roohparvar | 365/185.05 |
| 2009/0052242 A1 | 2/2009 | Takekida et al. | |
| 2010/0165733 A1 | 7/2010 | Nakamura et al. | |
| 2012/0201083 A1 | 8/2012 | Fujiu | |

* cited by examiner

WRITING METHOD OF NONVOLATILE SEMICONDUCTOR MEMORY DEVICE

CROSS-REFERENCE TO RELATED APPLICATIONS

This application is based upon and claims the benefit of priority from provisional Application Ser. No. 61/681,323, filed on Aug. 9, 2012; the entire contents of which are incorporated herein by reference.

FIELD

Embodiments described herein relate generally to a writing method of a nonvolatile semiconductor memory device.

BACKGROUND

In a memory cell of the nonvolatile semiconductor memory device, for example, at the time of writing data, charge is added in a charge storage region from a semiconductor substrate through a tunnel insulating film. Further, for example, at the time of erasing data, the charge is removed from the charge storage region onto the semiconductor substrate through the tunnel insulating film. However, whenever the charge passes through the tunnel insulating film, stress may be applied thereto, which may deteriorate the tunnel insulating film. Therefore, it is required to improve the reliability of the nonvolatile semiconductor memory device.

DETAILED DESCRIPTION

In general, according to one embodiment, there is provided a writing method of a nonvolatile semiconductor memory device. The nonvolatile semiconductor memory device includes a plurality of strings, a plurality of bit lines, and a plurality of word lines. In each of the plurality of strings, the memory cells are connected in series. The bit lines are connected to the strings. The word lines intersect the strings to be connected to control gates of the memory cells. The method includes setting potentials of the plurality of word lines to a first potential in a bit line potential setting state. The first potential is a potential to allow the memory cells corresponding to a selective bit line to be in on state. The selective bit line is a bit line corresponding to a selective memory cell among the plurality of bit lines. The bit line potential setting state is a state where a potential of the selective bit line is set to a selective potential and where a potential of a non-selective bit line is set to a non-selective potential. The method also includes setting potentials of non-adjacent word lines to a second potential while maintaining potentials of adjacent word lines at a potential which allows the memory cells corresponding to the selective bit line to be in on state and setting a potential of a selective word line to a third potential in the bit line potential setting state. The selective word line is a word line corresponding to the selective memory cell among the plurality of word lines. The adjacent word lines are word lines which are adjacent at both sides of the selective word line among the plurality of word lines. The non-adjacent word lines are word lines which are disposed outside the adjacent word lines among the plurality of word lines. The second potential is a potential which is determined so as to allow the memory cells corresponding to the selective bit line to be in off state. The third potential is a potential where data is written in the selective memory cell corresponding to the selective bit line.

Exemplary embodiments of a writing method of a nonvolatile semiconductor memory device will be explained below in detail with reference to the accompanying drawings. The present invention is not limited to the following embodiments.

(First Embodiment)

Figure 1:
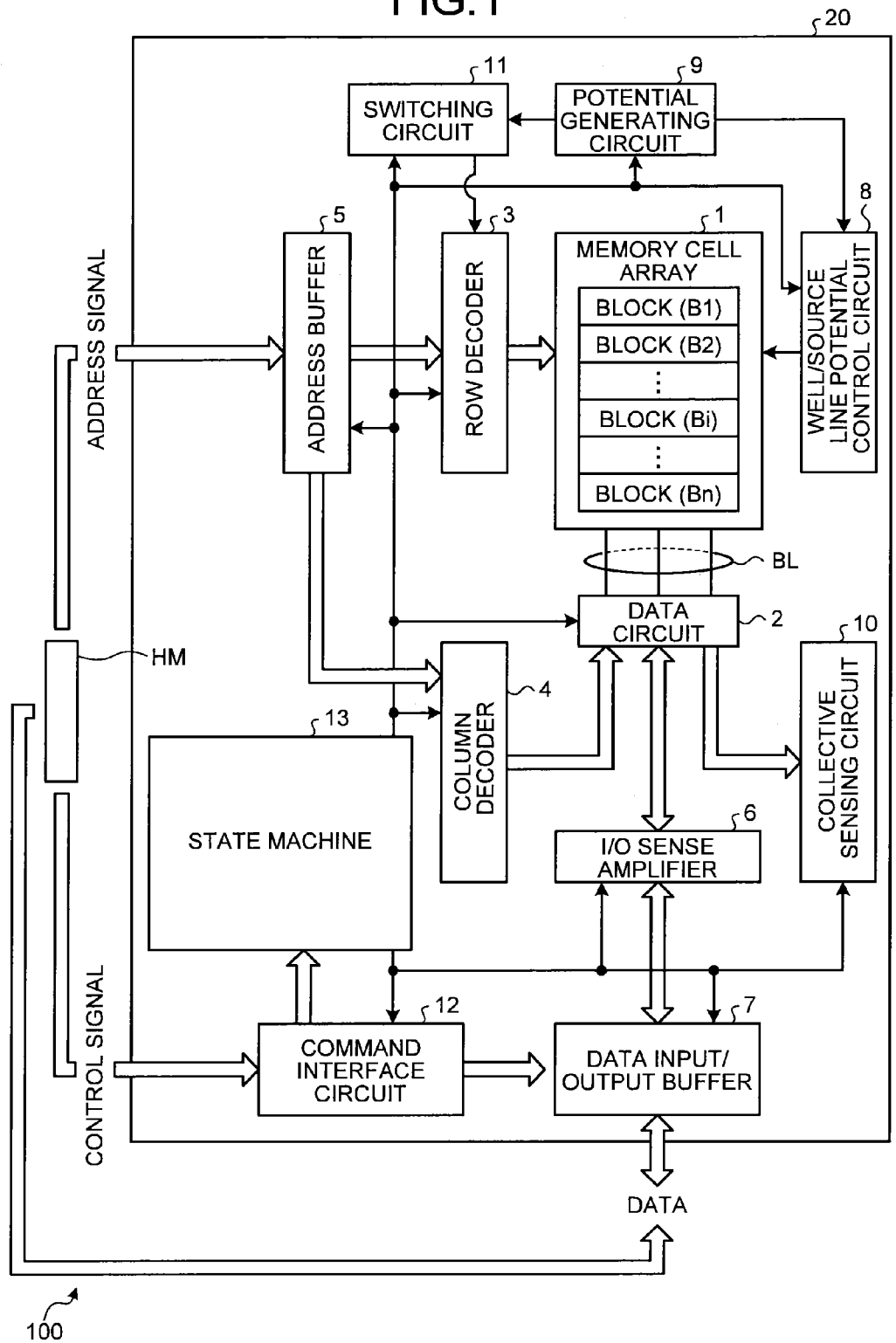
FIG. 1 is a view illustrating a schematic configuration of a nonvolatile semiconductor memory device according to a first embodiment.
Figure 2:
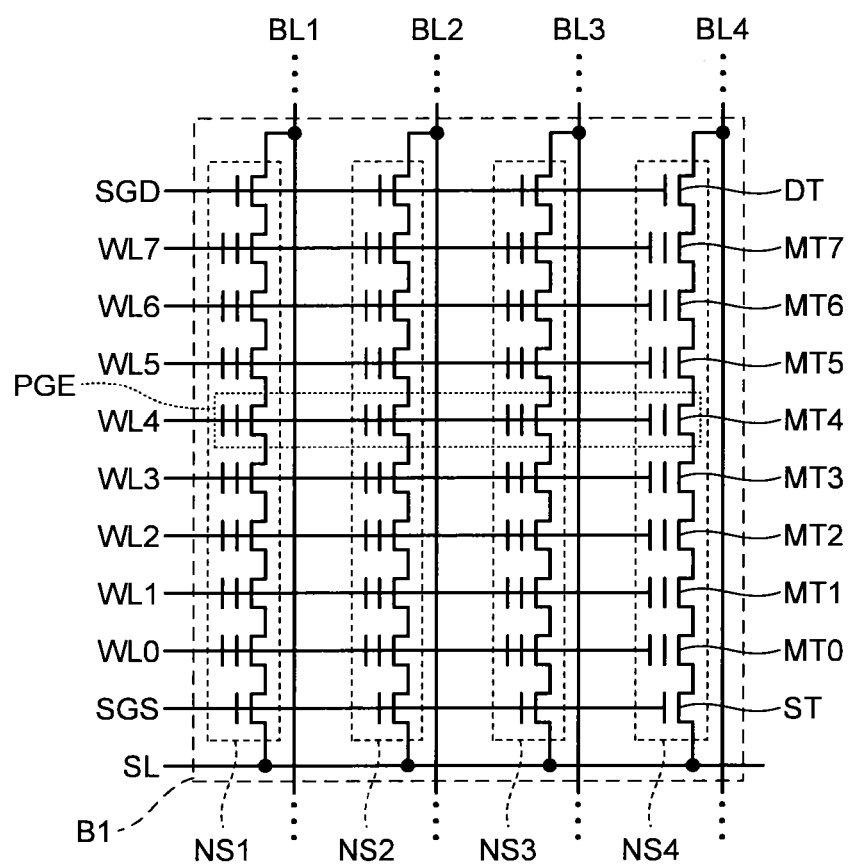
FIG. 2 is a view illustrating a configuration of a memory cell array according to the first embodiment.

A nonvolatile semiconductor memory device according to a first embodiment will be described with reference to FIGS. 1 and 2. FIG. 1 is a view illustrating a schematic configuration of the nonvolatile semiconductor memory device 100. FIG. 2 is a view illustrating a configuration of a memory cell array 1 in the nonvolatile semiconductor memory device 100 in one block.

The nonvolatile semiconductor memory device 100, as illustrated in FIG. 1, includes a memory chip 20. The memory chip 20 is provided with a memory cell array 1, a data circuit 2, a row decoder 3, a column decoder 4, an address buffer 5, an I/O sense amplifier 6, a data input/output buffer 7, a well/source line potential control circuit 8, a potential generating circuit 9, a switching circuit 11, a collective sensing circuit 10, a command interface circuit 12, and a state machine 13.

In the memory cell array 1, a plurality of memory cells are arranged so as to form a plurality of rows and a plurality of columns. For example, in the memory cell array 1, n (n is a positive integer) blocks B1 to Bn are included, and in each of the blocks B1 to Bn, for example, as illustrated in FIG. 2, a plurality of NAND strings NS1 to NS4 are disposed. The plurality of NAND strings NS1 to NS4, for example, extend in a column direction and are arranged in a row direction. Each of the NAND strings NS1 to NS4 includes, for example, a plurality of memory cells MT0 to MT7, which are connected in series to each other, and two select gates ST and DT which are connected at both ends of the memory cells, respectively (see FIG. 2).

The plurality of word lines extend in the row direction respectively and are arranged in the column direction. For example, as illustrated in FIG. 2, the plurality of word lines WL0 to WL7 extend in the row direction respectively and are arranged in the column direction. In other words, the plurality of word lines WL0 to WL7 are connected to the control gates of the memory cells so as to intersect the plurality of NAND strings NS1 to NS4 (see FIG. 3A).

The plurality of bit lines extend in the column direction respectively and are arranged in the row direction. For example, as illustrated in FIG. 2, the plurality of bit lines BL1 to BL4 extend in the column direction respectively and are arranged in the row direction. In other words, the plurality of bit lines BL1 to BL4 correspond to the plurality of NAND strings NS1 to NS4.

The data circuit 2 includes a plurality of latches (memory circuits). The data circuit 2 temporarily stores, for example, 4 bits (hexadecimal) of write data at the time of writing and, for example, 4 bits (hexadecimal) of read data at the time of reading, respectively. Therefore, at least 6 latches are provided for one bit line BL which is connected to a memory cell selected to be a target of a writing/reading operation. One of the six latches stores logically lower page data, and another latch stores logically upper page data.

The row decoder 3 includes a row address decoder and a word line driver. The row decoder 3 selects a row in the memory cell array 1 based on an operation mode (write, read, erase, and the like) and an address designated by a row address signal and controls potentials of the plurality of word lines in the memory cell array 1 to be predetermined potentials. For example, the row decoder 3 sets a potential of the selective word line which corresponds to a selective memory cell at the time of writing to be a transfer potential Vpass (for example, approximately 10 V) or a program potential Vpgm (for example, approximately 18 V).

The column decoder 4 includes a column address decoder and a bit line driver. The column decoder 4 selects a column in the memory cell array 1 based on an operation mode (write, read, erase, and the like) and an address designated by a column address signal and controls potentials of the plurality of bit lines in the memory cell array 1 to be predetermined potentials. At the time of writing, write data is input to a memory circuit in the data circuit 2 which belongs to a selective column via the data input/output buffer 7 and the I/O sense amplifier 6. For example, the column decoder 4 sets a potential of the selective bit line which corresponds to a selective memory cell at the time of writing to be a selective potential (for example, approximately 0 V) and a potential of a non-selective bit line to be a non-selective potential (for example, approximately 3 V).

Further, at the time of reading, the read data is temporarily stored in a memory circuit in the data circuit 2 which belongs to the selective column and then output outside the memory chip 20 via the I/O sense amplifier 6 and the data input/output buffer 7.

The row address signal among the address signals is input to the row decoder 3 via the address buffer 5. Further, the column address signal is input to the column decoder 4 via the address buffer 5.

The well/source line potential control circuit 8 controls potentials in a plurality of well regions (for example, a double well region configured of a n well and a p well) corresponding to the blocks B1 to Bn and a potential of a source line in response to the operation mode (write, read, erase, and the like).

The potential generating circuit 9, for example, generates a program potential Vpgm (for example, approximately 18 V) and a transfer voltage Vpass (for example, approximately 10 V) at the time of writing. The program potential Vpgm and the transfer potential Vpass are sorted in a plurality of word lines in one or two or more selective blocks which are selected from the blocks B1 to Bn by the switching circuit 11.

Further, the potential generating circuit 9, for example, generates an erasing potential VE (for example, approximately 20 V) at the time of erasing. The erasing potential VE is applied to one or two or more well regions (both n well and p well) corresponding to the one or two or more selective blocks selected from the blocks B1 to Bn.

The collective sensing circuit 10 verifies whether predetermined data is precisely written in the memory cell at the time of wiring and verifies whether the data of the memory cell is completely erased at the time of erasing.

The command interface circuit 12 determines whether data input to the data input/output buffer 7 is command data provided from a host micro computer based on a control signal generated by a separate chip (for example, host micro computer or memory controller HM) from the memory chip 20. If data which is input to the data input/output buffer 7 is command data, the command interface circuit 12 transfers the command data to the state machine 13.

The state machine 13 determines an operation mode (write, read, erase, and the like) of NAND flash memory based on the command data and controls the entire operations of the NAND flash memory, specifically, the operations of the data circuit 2, the row decoder 3, the column decoder 4, the address buffer 5, the I/O sense amplifier 6, the data input/output buffer 7, the well/source line potential control circuit 8, the potential generating circuit 9, the switching circuit 11, and the collective sensing circuit 10, respectively, in response to the operation mode.

Next, the more specific configuration of the memory cell array 1 will be described with reference to FIG. 2. FIG. 2 illustrates one block B1 among the plurality of blocks B1 to Bn included in the memory cell array 1, and the other blocks B2 to Bn are also similar to the block B1.

In FIG. 2, in the block B1 is provided with, for example, 8 word lines WL0 to WL7, select gate lines SGD and SGS, and a source line SL. Further, in the blocks B1 to Bn, for example, four bit lines BL1 to BL4 are commonly provided. Further, FIG. 2 illustrates eight word lines and four bit lines as an example. However, the number of word lines and the number of bit lines are not limited thereto.

In the block B1, four NAND strings NS1 to NS4 are arranged in the row direction, and the NAND strings NS1 to NS4 correspond to the bit lines BL1 to BL4, respectively and are connected to the corresponding bit lines BL1 to BL4, respectively.

In the NAND strings NS1 to NS4, memory cells MT0 to MT7 and the select gates DT and ST are provided along the column direction. Each of the memory cells MT0 to MT7, for example, is one transistor. The memory cells MT0 to MT7 are connected to each other in series. Each of the memory cells MT0 to MT7, for example, as illustrated in FIG. 3B, has a gate electrode 30 in which a tunnel insulating film 31, a charge storage region 32, an insulating film 33, and a control gate 34 are stacked in this order on a semiconductor substrate SB, has a channel region 60 below the gate electrode 30 in the semiconductor substrate SB, and has a source region 40 and a drain region 50 at both sides of the channel region 60 in the semiconductor substrate SB. The charge storage region 32, for example, is a floating gate or an ONO film.

For example, if a charge (for example, electron) to be written in the charge storage region 32 corresponds to a first conductive type (for example, an N type), the memory cells MT0 to MT7, for example, are transistors corresponding to the first conductive type (for example, Nch transistor). In this case, the channel region 60 is formed of a semiconductor (for example, silicon) containing impurity (for example, boron) of a second conductive type (for example, P type) which is a conductive type opposite to the first conductive type. The source region 40 is formed of a semiconductor (for example, silicon) containing impurity (for example, phosphorus or arsenic) of a first conductive type (for example, N type) which has a higher concentration than that of impurity of a second conductive type (for example, P type) in the channel region 60. The drain region 50 is formed of a semiconductor (for example, silicon) containing impurity (for example, phosphorus or arsenic) of the first conductive type (for example, N type) which has a higher concentration than that impurity of the second conductive type (for example, P type) in the channel region 60.

Further, each of the select gates DT and ST, for example, is one transistor. The select gate DT is connected in series to a memory cell MT7 which is at the most drain side among the memory cells MT0 to MT7 and the select gate ST is connected in series to a memory cell MT0 which is at the most source side among the memory cells MT0 to MT7 so as to configure each of the NAND strings NS1 to NS4.

In the NAND strings NS1 to NS4, the word lines WL0 to WL7 are connected to the control gate 34 of the memory cells MT0 to MT7. Further, one edge of each of the NAND strings NS1 to NS4 is connected to the bit lines BL1 to BL4 through the select gate DT and the other edge of each of the NAND strings NS1 to NS4 is connected to the source line SL through the select gate ST.

Further, in the NAND strings NS1 to NS4, when one memory cell can store one bit, for example, four memory cells MTk-1 to MTk-4 connected to the word line WLk may compose one page PGE. For example, the memory cell which is connected to WL3 and NS1 is denoted by MT3-1. Further, also when a multiple value of p bits (p is an integer of 2 or larger) is stored in one memory cell, for example, at most p pages PGE may be configured in four memory cells MTk-1 to MTk-4 connected to the word line WLk.

FIGS. 22A to 23C illustrate memory cell array 1 to explain, as a comparative example, a method how to write in the selective memory cell MT3-1.

Figure 22A:
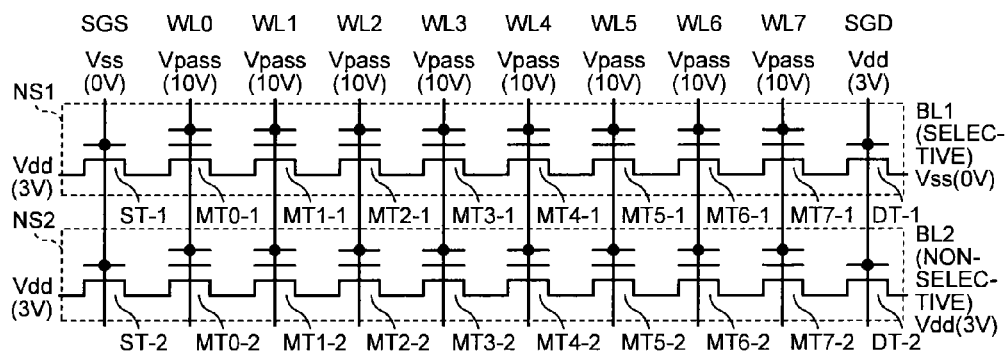
FIGS. 22A to 22C are views illustrating an operation of a memory cell array according to a comparative example.
Figure 22B:
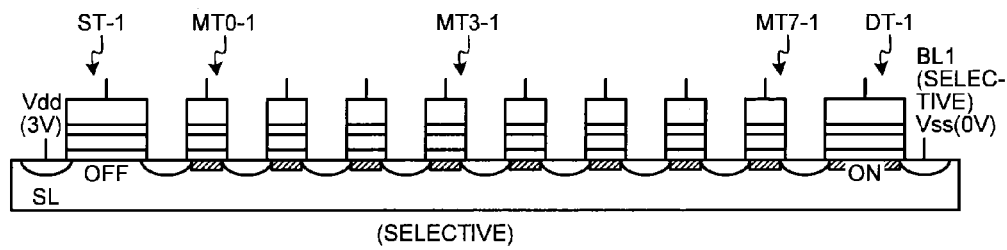
Figure 22C:
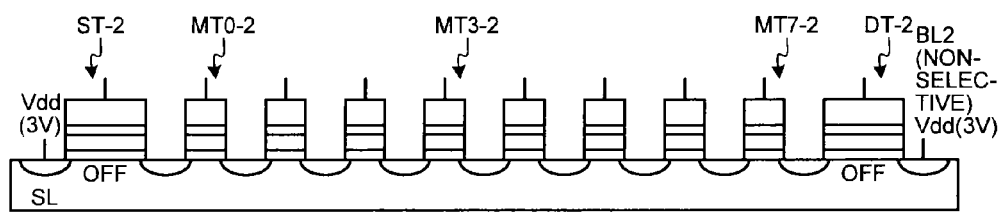

Specifically, in the process illustrated in FIGS. 22A and 22C, a potential of the selective bit line BL1 corresponding to the selective memory cell MT3-1 is set to be a selective potential Vss (for example, 0 V) and a potential of the non-selective bit line BL2 is set to be a non-selective potential Vdd (for example, 3 V). In this state (bit line potential setting state), all of the potentials of the plurality of word lines WL0 to WL7 are set to be a transfer potential Vpass (for example, 10 V). The transfer potential Vpass, for example, is a potential that allows the memory cells MT0-1 to MT7-1 corresponding to the selective bit line BL1 to be in on state. Further, a potential of the select gate line SGD at the drain side is raised to a potential which allows the select gate DT-1 at the drain side corresponding to the selective bit line BL1 to be in on state and the select gate DT-2 at the drain side corresponding to the non-selective bit line BL2 to be in off state, for example, a potential Vdd which is equivalent to a non-selective potential of the bit line (for example, raised from 0 V to 3 V). In the meantime, a potential of the select gate line SGS at the source side is set to a potential that allows the select gates ST-1 and ST-2 at the source side to be in off state, for example, a ground potential Vss (for example, 0 V). In other words, the select gates ST-1 and ST-2 at the source side become off state so that a common source line SL which is set to a potential Vdd and the memory cells MT0-1 to MT7-1 and MT0-2 to MT7-2 are disconnected electrically.

In this case, in the NAND string NS1 including the selective memory cell MT3-1, the memory cells MT0-1 to MT7-1 are connected to the selective bit line BL1. Therefore, a channel potential Vch-1 of each of the memory cells MT0-1 to MT7-1 between the two select gates ST-1 and DT-1 uniformly becomes a selective potential Vss (for example, 0 V) of the selective bit line BL1. In other words, charge to be written in the selective memory cell MT3-1 is supplied from the selective bit line BL1 into a channel region 60 (see FIG. 3) of each of the memory cells MT0-1 to MT7-1 of the NAND string NS1 including the selective memory cell MT3-1.

In the meantime, in the NAND string NS2 corresponding to the non-selective bit line BL2, each of the memory cells MT0-2 to MT7-2 is connected to the non-selective bit line BL2. Therefore, the non-selective potential Vdd (for example, 3 V) of the non-selective bit line BL2 is supplied to the channel region 60 of each of the memory cells MT0-2 to MT7-2 between two select gates ST-2 and DT-2. If a threshold of the select gate DT (transistor) to which a back bias is applied is Vth_sgd (for example, 1 V), when a channel potential Vch-2 of each of the memory cells MT0-2 to MT7-2 reaches Vdd-Vth_sgd (for example, 2 V), the select gate DT-2 at the drain side becomes in off state. For an actual operation time, the charge (for example, electron) is not substantially supplied above the threshold no longer, and the channel of the charge (for example, electron) is not formed. Therefore, the channel potential Vch-2 of each of the memory cells MT0-2 to MT7-2 is further raised (boosted) by a capacitive coupling with the word lines WL0 to WL7 having potentials raised to the transfer potential Vpass. In other words, the channel potential of each of the memory cells MT0-2 to MT7-2 corresponding to the non-selective bit line BL2 is set to a potential Vch-2' which is boosted so that the data is not written in a memory cell MT3-2 corresponding to the non-selective bit line BL2 where the control gate 34 is connected to the selective word line WL3 when the potential of the selective word line WL3 is set to a program potential Vpgm (for example, 18 V) which will be described below.

Figure 23A:
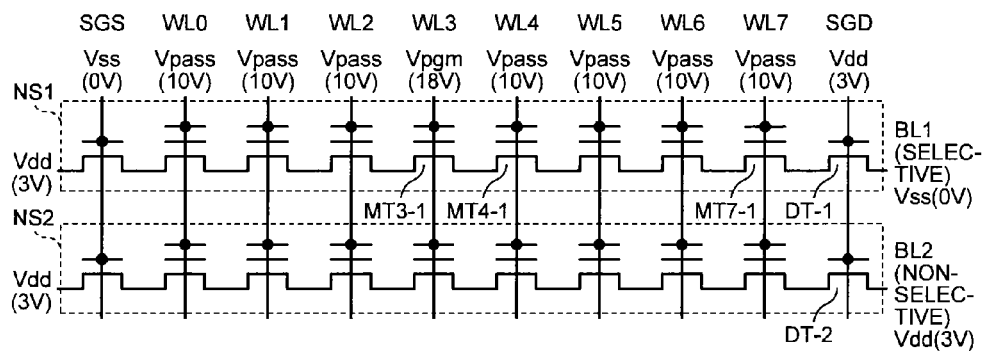
FIGS. 23A to 23C are views illustrating an operation of the memory cell array according to the comparative example.
Figure 23B:
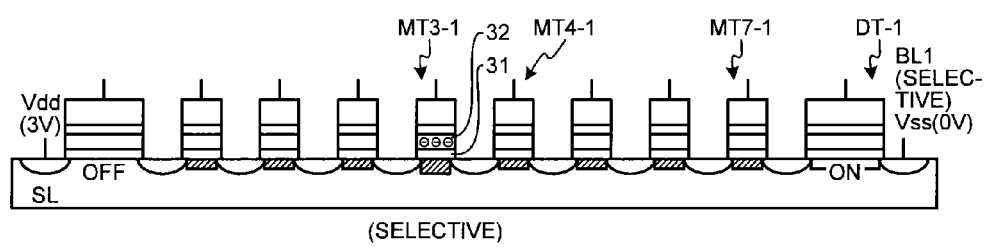
Figure 23C:
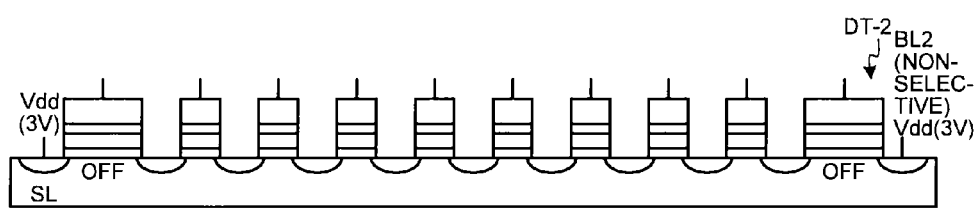

Next, in the process illustrated in FIGS. 23A to 23C, the potential of the selective word line WL3 corresponding to the selective memory cell MT3-1 is set to the program potential Vpgm (for example, 18 V) and the potentials of the non-selective word lines WL0 to WL2 and WL4 to WL7 are maintained at the transfer potential Vpass. Accordingly, in the NAND string NS1 corresponding to the selective bit line BL1, in the selective memory cell MT3-1, charge is written from the channel region 60 to the charge storage region 32 through the tunnel insulating film 31 so that the data is written in the selective memory cell MT3-0. In contrast, in the NAND string NS2 corresponding to the non-selective bit line BL2, the select gate DT-2 at the drain side is in off state and the channel potential of each of the memory cells MT0-2 to MT7-2 becomes a potential Vch-2' which is boosted so that the data is not written in the memory cell MT3-2 where the control gate 34 is connected to the selective word line WL3. Therefore, the channel of the charge (for example, electron) is not formed and the data is not written.

In the control to perform the process illustrated in FIGS. 22A to 22C and the process illustrated in FIGS. 23A to 23C, after setting the potential of the selective word line WL3 to the program potential Vpgm, data is written in the selective memory cell MT3-1 for a predetermined time. In this case, a charge (for example, electron) is supplied from the selective bit line BL1 to the channel region 60 of the selective memory cell MT3-1 through adjacent memory cells MT4-1 to MT7-1 and the select gate DT-1 substantially without limitation. Therefore, even when the charge is written in the charge storage region 32 of the selective memory cell MT3-1 by a target charge amount before the writing time is completed, the writing is not stopped so that overmuch quantity of charges is likely to be written in the charge storage region 32 of the selective memory cell MT3-1. That is, too much data is likely to be written in the selective memory cell MT3-1. Accordingly, the overmuch quantity of charges pass through the tunnel insulating film 31 of the selective memory cell MT3-1 so that the stress more than necessary may be applied to the tunnel insulating film 31 of the selective memory cell MT3-1 to be deteriorated, which may accelerate the lowering of the reliability of the various operations of the nonvolatile semiconductor memory device 100.

Further, when a multiple value of p bits (p is an integer of 2 or larger) is written in one memory cell, if the data is written too much before reaching an adjacent writing level, error (writing disturb) may be caused, which may lower the reliability of the writing operation of the nonvolatile semiconductor memory device 100.

Therefore, in the first embodiment, instead of the control illustrated in FIGS. 22A to 23C, control illustrated in FIGS. 3A to 6C is performed to suppress the overmuch quantity of charges from being written in the charge storage region 32 of the selective memory cell MT3-1. FIGS. 3A to 6C are views illustrating an operation of the memory cell array 1 according to the first embodiment.

Figure 3A:
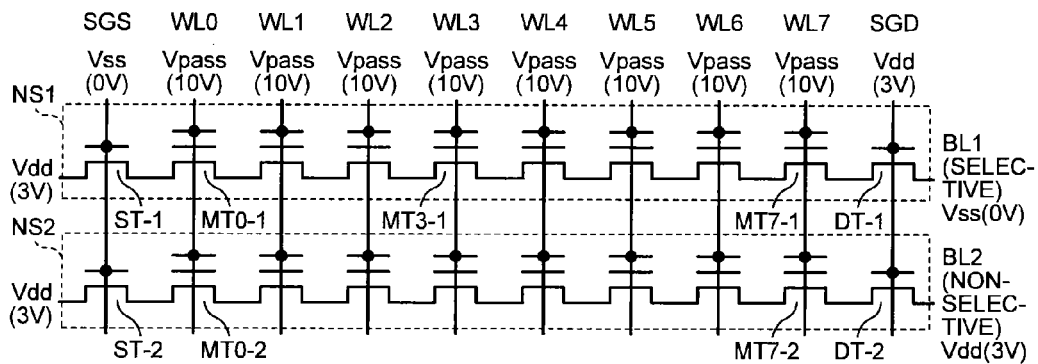
FIGS. 3A to 3C are views illustrating an operation of the memory cell array according to the first embodiment.
Figure 3B:
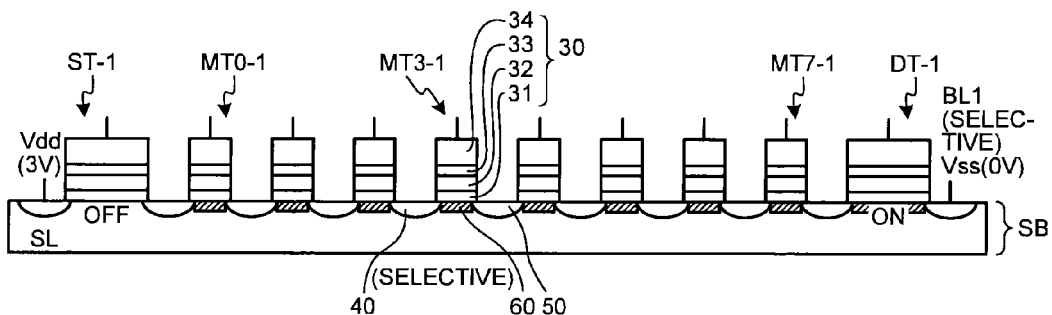
Figure 3C:
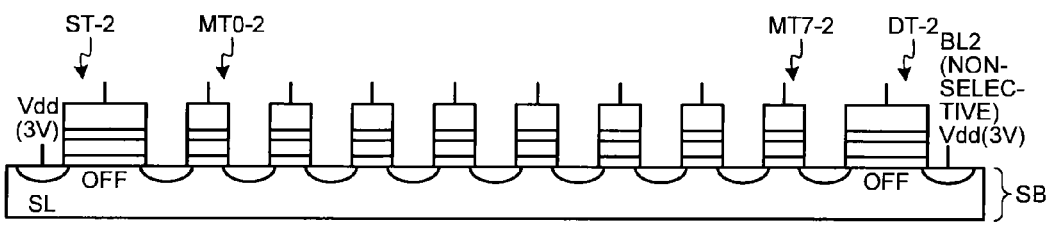

Specifically, in the process illustrated in FIGS. 3A to 3C, the channel potential of each of the memory cells in the NAND string including the selective memory cell is set to the selective potential of the bit line. In other words, the potential of the selective bit line BL1 corresponding to the selective memory cell MT3-1 is set to the selective potential Vss (for example, 0 V) and the potential of the non-selective bit line BL2 is set to a non-selective potential Vdd (for example, 3 V).

In this state, all of the potentials of the plurality of word lines WL0 to WL7 are set to the transfer potential (first potential) Vpass (for example, 10 V). The transfer potential Vpass, for example, is a potential that allows the memory cells MT0-1 to MT7-1 corresponding to the selective bit line BL1 to be in on state. The potential difference between the transfer potential Vpass and the selective potential Vss is smaller than the potential difference between the program potential Vpgm and the selective potential Vss. In other words, the transfer potential Vpass is not so higher that the charge is written in the memory cells MT0-1 to MT7-1 corresponding to the selective bit line BL1. Further, the transfer potential Vpass is a potential for forming a charge channel in the channel region 60 of the memory cells MT0-1 to MT7-1 and transferring the charge. Further, the potential of the select gate line SGD at the drain side is raised to a potential that allows the select gate DT-1 at the drain side corresponding to the selective bit line BL1 to be in on state and the select gate DT-2 at the drain side corresponding to the non-selective bit line BL2 to be in off state, for example, a potential Vdd equivalent to the non-selective bit line BL2 (for example, raised from 0 V to 3 V). In the meantime, the potential of the select gate line SGS at the source side is set to a potential that allows the select gates ST-1 and ST-2 at the source side to be in off state, for example, a ground potential Vss (for example, 0 V). In other words, the select gates ST-1 and ST-2 at the source side are in off state and the memory cells MT0-1 to MT7-1 and MT0-2 to MT7-2 are disconnected electrically from the common source line SL.

In this case, in the NAND string NS1 including the selective memory cell MT3-1, each of the memory cells MT0-1 to MT7-1 is connected to the selective bit line BL1 so that the channel potential Vch-1 of each of the memory cells MT0-1 to MT7-1 between two select gates ST-1 and DT-1 uniformly becomes a selective potential Vss (for example, 0 V) of the selective bit line BL1. In other words, charge to be written in the selective memory cell MT3-1 is supplied from the selective bit line BL1 into a channel region 60 of each of the memory cells MT0-1 to MT7-1 of the NAND string NS1 including the selective memory cell MT3-1.

In the meantime, in the NAND string NS2 corresponding to the non-selective bit line BL2, each of the memory cells MT0-2 to MT7-2 is connected to the non-selective bit line BL2. Therefore, the non-selective potential Vdd (for example, 3 V) of the non-selective bit line BL2 is supplied to the channel region 60 of each of the memory cells MT0-2 to MT7-2 between two select gates ST-2 and DT-2. If a threshold of the select gate DT-2 (transistor) to which a back bias is applied is Vth_sgd (for example, 1 V), when a channel potential Vch-2 of each of the memory cells MT0-2 to MT7-2 reaches Vdd-Vth_sgd (for example, 2 V), the select gate DT-2 at the drain side becomes in off state. For an actual operation time, the charge (for example, electron) is not substantially supplied above the threshold no longer, and the channel of the charge (for example, electron) is not formed. Therefore, the channel potential Vch-2 of each of the memory cells MT0-2 to MT7-2 is further raised (boosted) by a capacitive coupling with the word lines WL0 to WL7 having potentials raised to the transfer potential Vpass. In other words, the channel potential of each of the memory cells MT0-2 to MT7-2 corresponding to the non-selective bit line BL2 is set to a potential Vch-2' which is boosted so that the data is not written in a memory cell MT3-2 corresponding to the non-selective bit line BL2 where the control gate 34 is connected to the selective word line WL3 when the potential of the selective word line WL3 is set to a program potential Vpgm (for example, 18 V) which will be described below.

Figure 4A:
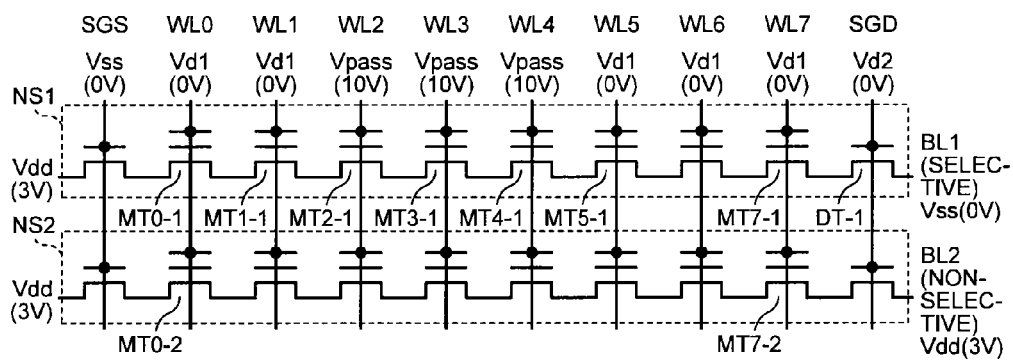
FIGS. 4A to 4C are views illustrating an operation of the memory cell array according to the first embodiment.
Figure 4B:
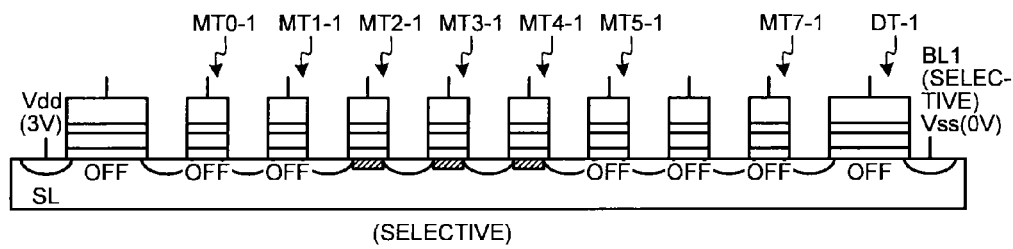
Figure 4C:
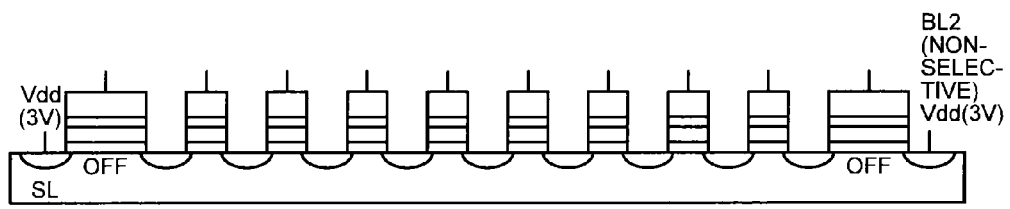

In the process illustrated in FIGS. 4A to 4C, the channel region 60 of the selective memory cell MT3-1 is electrically disconnected from the selective bit line BL1. In other words, a potential of non-adjacent word lines WL0, WL1, and WL5 to WL7 which are disposed outside the adjacent word lines WL2 and WL4 is set to a second potential Vd1 (for example, 0 V) while maintaining a potential of the selective word line WL3 corresponding to the selective memory cell MT3-1 and potentials of adjacent word lines WL2 and WL4 which are adjacent at both sides of the selective word line WL3, respectively at the transfer potential (first potential) Vpass. The second potential Vd1, for example, is a potential where the memory cells MT0-1, MT1-1, and MT5-1 to MT7-1 corresponding to the selective bit line BL1 are determined so as to be in off state. Further, the potential of the select gate line SGD at the drain side is dropped to a potential which allows the select gates DT-1 and DT-2 at the drain side to be in off state, for example, a potential Vd2 equivalent to the selective potential Vss of the selective bit line BL1 (for example, dropped from 3 V to 0 V).

By doing this, in the NAND string NS1 corresponding to the selective bit line BL1, the non-adjacent memory cells MT0-1, MT1-1, and MT5-1 to MT7-1 which are disposed outside the adjacent memory cells MT2-1 and MT4-1 and the select gate DT-1 are in off state while maintaining the selective memory cell MT3-1 and the adjacent memory cells MT2-1 and MT4-1 in on state, and the channel region 60 of the selective memory cell MT3-1 is electrically disconnected from the selective bit line BL1. In other words, the non-adjacent memory cells MT0-1, MT1-1, and MT5-1 to MT7-1 are in off state while retaining the channel potential Vch of the selective memory cell MT3-1 at the selective potential Vss (for example, 0 V) of the bit line.

Further, depending on the threshold of each of the non-adjacent memory cells MT0-1, MT1-1, and MT5-1 to MT7-1, even though the non-adjacent word lines WL0, WL1, and WL5 to WL7 are set to the second potential (for example, 0 V) Vd1, in some cases, the memory cell is maintained in a half-on state. However, by setting at least the non-adjacent word lines WL0, WL1, and WL5 to WL7 to the second potential Vd1, it may become hard for the charge to pass over the channel region 60 of each of the non-adjacent memory cells MT0-1, MT1-1, and MT5-1 to MT7-1 and reach the channel region 60 of the adjacent memory cell. Therefore, it is possible to restrict the amount of the charge which may be supplied to the channel region 60 of the selective memory cell MT3-1. Further, the potential of the select gate line SGD at the drain side is dropped to Vd2 to allow the select gate DT-1 to be in off state. Therefore, the charge is restricted from being supplied at least from the selective bit line BL1 into the channel region 60 of the selective memory cell MT3-1 without limitation.

Alternately, in consideration of the variation of the thresholds of the non-adjacent memory cells MT0-1, MT1-1, and MT5-1 to MT7-1, a value of the second potential Vd1 may be set to be a negative value (for example, −3 V). Accordingly, the non-adjacent memory cells MT0-1, MT1-1 and MT5-1 to MT7-1 may be surely off regardless of the threshold.

Figure 5A:
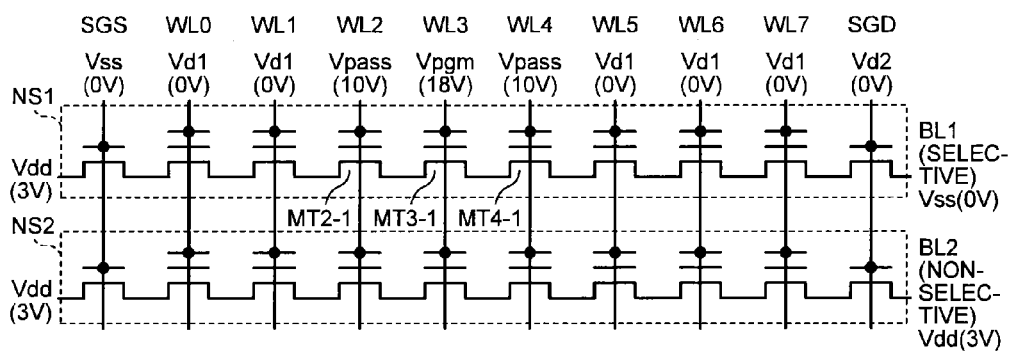
FIGS. 5A to 5C are views illustrating an operation of the memory cell array according to the first embodiment.
Figure 5B:
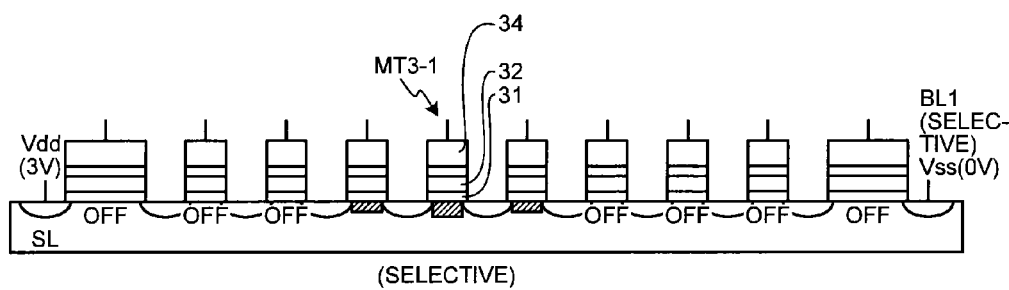
Figure 5C:
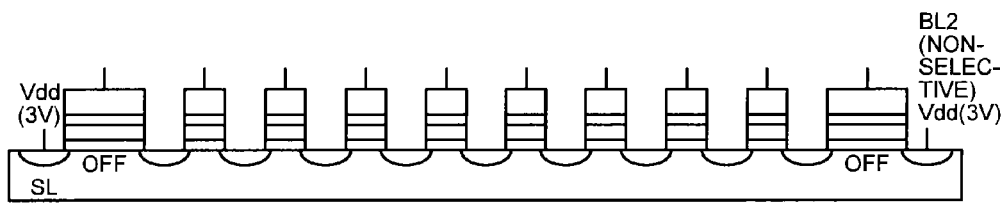

Next, in the process illustrated in FIGS. 5A to 5C, the data is written in the selective memory cell MT3-1. In other words, the potential of the selective word line WL3 is set to be a program potential (third potential) Vpgm (for example, 18 V) while maintaining the potentials of the adjacent word lines WL2 and WL4 at the transfer potential (first potential) Vpass (for example, 10 V) and the potentials of the non-adjacent word lines WL0, WL1, WL5 to WL7 at the second potential (Vd1). The program potential Vpgm is a potential that allows data to be written in the memory cell MT3-1 corresponding to the selective bit line BL1. The potential difference between the program potential Vpgm and the selective potential Vss is larger than the potential difference between the transfer potential Vpass and the selective potential Vss. In other words, the program potential Vpgm is raised so that charge is selectively written in the selective memory cell MT3-1.

Therefore, in the NAND string NS1 corresponding to the selective bit line BL1, in the selective memory cell MT3-1, the charge is written from the channel region 60 through the tunnel insulating film 31 in the charge storage region 32 so that data is written in the selective memory cell MT3-1. In the meantime, in the NAND string NS2 corresponding to the non-selective bit line BL2, the select gate DT-2 at the drain side becomes in off state and the channel potential of each of the memory cells MT0-2 to MT7-2 is a potential Vch-2' boosted so that the data is not written in the memory cell MT3-2 where the control gate 34 is connected to the selective word line WL3. Therefore, a channel for the charge (for example, electron) is not formed and data is not written.

Figure 6A:
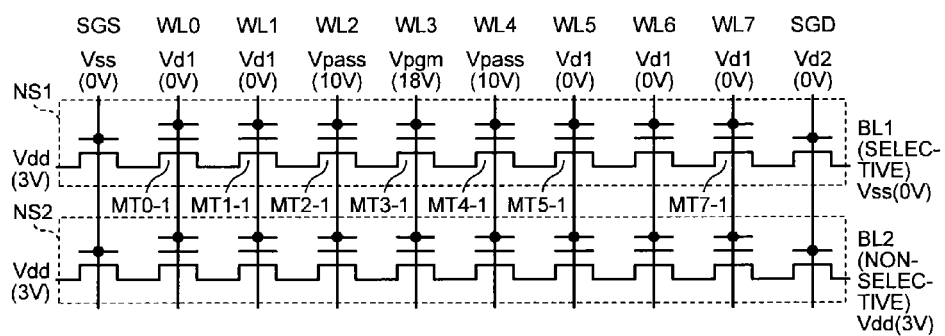
FIGS. 6A to 6C are views illustrating an operation of the memory cell array according to the first embodiment.
Figure 6B:
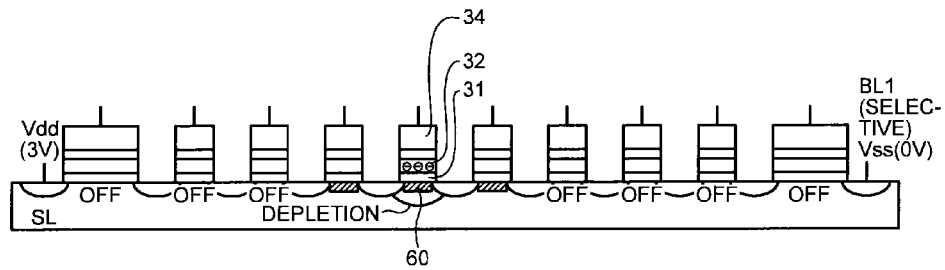
Figure 6C:
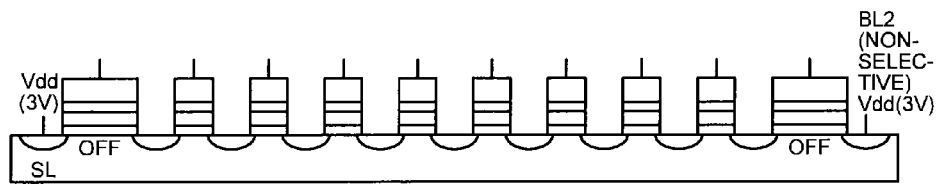

Next, in the process illustrated in FIGS. 6A to 6C, the speed of writing the data in the selective memory cell MT3-1 is lowered in a self-limited process. In other words, immediately after applying the program potential Vpgm (the process illustrated in FIGS. 5A to 5C), the charge starts to be written in the charge storage region 32 with the potential difference between the channel potential Vch (=Vss (for example, 0 V)) of the selective memory cell MT3-1 and the program potential Vpgm of the control gate 34. However, as the charge (for example, electron) of the channel region 60 moves to the charge storage region 32 (the process illustrated in FIGS. 6A to 6C), the amount of charges (for example, electrons) of the channel region 60 is reduced. Therefore, the channel region 60 of the selective memory cell MT3-1 is depleted and the channel potential Vch of the selective memory cell MT3-1 is raised. By doing this, the charge is supplied from the channel region 60 of the adjacent memory cells MT2-1 and MT4-1 to the channel region 60 of the selective memory cell MT3-1, but the charge is hardly supplied from the channel region 60 of the non-adjacent memory cells MT0-1, MT1-1, and MT5-1 to MT7-1. Therefore, it is possible to restrict the amount of charges which may be supplied to the channel region 60 of the selective memory cell MT3-1. Therefore, as compared with the control illustrated in FIGS. 22A to 23C, it is possible to suppress overmuch quantity of charges from being written in the charge storage region 32 of the selective memory cell MT3-1. In other words, it is possible to sharply lower the speed of writing data in the selective memory cell MT3-1 in a self-limited process and prevent the data from being written in the selective memory cell MT3-1 too much.

Figure 7A:
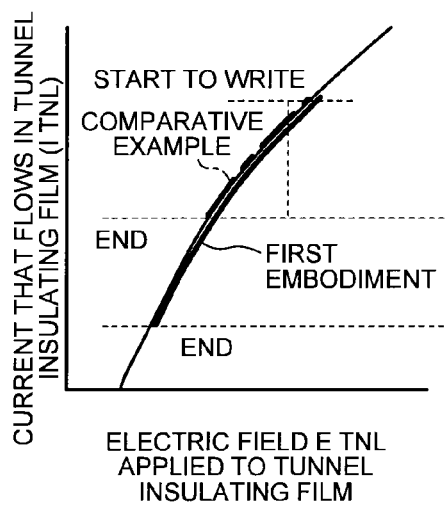
FIGS. 7A and 7B are views illustrating an effect of the first embodiment.
Figure 7B:
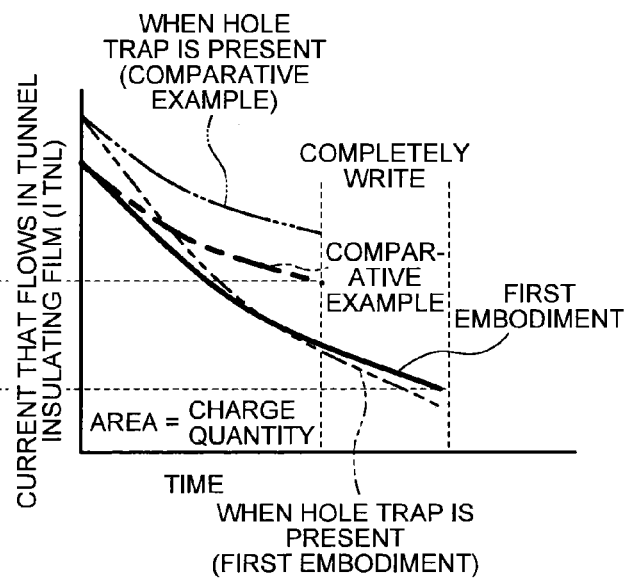

Next, an effect of the first embodiment will be described with reference to FIGS. 7A and 7B. FIG. 7A is an I-E diagram which illustrates a relationship between en electric field E applied to the tunnel insulating film 31 (see FIG. 3B) and the tunnel current I which flows through the tunnel insulating film 31 for a comparative example and the first embodiment. FIG. 7B is an I-t diagram which illustrates a relationship between a time t after starting to write and the tunnel current I which flows through the tunnel insulating film 31 for the comparative example and the first embodiment.

In this embodiment, at the time of writing, the current that flows through the tunnel insulating film 31 of the selective memory cell MT3-1 changes as illustrated by the solid line of FIGS. 7A and 7B. In the charge storage region 32 of the selective memory cell MT3-1, a charge Q is injected from the channel region 60 with an F-N (Fowler-Nordheim) current. At the time of starting to write, the current value is set to be equivalent to that of the comparative example (one-dot chain line of FIGS. 7A and 7B). In response to the written charge Q, a tunnel current is reduced (one-dot chain line of FIGS. 7A and 7B). In this embodiment, as the channel potential Vch of the selective memory cell MT3-1 is raised, the writing speed is further sharply lowered (the solid line of FIGS. 7A and 7B). Therefore, the writing time is longer than that of the comparative example so that the charge quantity to be finally written may be equivalent to that of the comparative example.

Here, suppose a case where a memory cell having a high writing speed is generated. For example, if a hole trap is generated in the tunnel insulating film 31 of the selective memory cell MT3-1, a barrier height of the tunnel insulating film 31 is lowered so that the tunnel current is likely to be increased (three-dot chain line of FIG. 7B). Additionally, even when a coupling ratio between the control gate 34, the charge storage region 32, and the semiconductor substrate SB is uneven due to the variation of the processed shape, similarly, a memory cell having a high writing speed may be obtained. Here, since the writing time is fixed, the charge quantity which is written in the charge storage region 32 is increased by the increased amount of the tunnel current. In proportion to the increased amount ΔQ of the charge quantity, a threshold Vth of the memory cell is increased. In other words, the memory cell can become in an overwritten state. Accordingly, as the current which flows in the tunnel insulating film 31 is simply increased, stress may be applied too much to the tunnel insulating film 31 to be deteriorated. As a result, the deterioration of the reliability of the various operations of the nonvolatile semiconductor memory device 100 may be accelerated. Further, when a multiple value of p bits (p is an integer of 2 or larger) is written in one memory cell, the multiple value interferes with adjacent writing levels, which may cause the error (writing disturb). Therefore, the reliability of the writing operation of the nonvolatile semiconductor memory device 100 may be lowered.

In this embodiment, if the initial writing is fast, the increase of the channel potential Vch of the selective memory cell MT3-1 tends to be fast. In some cases, the writing speed at the time of completing to write may be slower compared to a case that does not have a hole trap (two-dot chain line of FIG. 7B). The increase of the writing speed by the hole trap is restricted by increasing the channel potential Vch so that the increasing charge quantity ΔQ may be restricted as compared with the comparative example.

As described above, in the first embodiment, in the process illustrated in FIGS. 3A to 3C, in the state where the potential of the selective bit line BL1 is set to the selective potential Vss and the potential of the non-selective bit line BL2 is set to the non-selective potential Vdd, the potentials of all of the plurality of word lines WL0 to WL7 are set to the transfer potential Vpass that allows the memory cells MT0-1 to MT7-1 corresponding to the selective bit line BL1 to be in on state. In the process illustrated in FIGS. 4A to 4C, in the above-mentioned state, while maintaining the potential of the selective word line WL3 and the potentials of the adjacent word lines WL2 and WL4 at the transfer potential (first potential) Vpass, the potentials of the non-adjacent word lines WL0, WL1, and WL5 to WL7 are set to be the second potential Vd1 which is determined to allow the memory cells MT0-1, MT1-1, and MT5-1 to MT7-1 corresponding to the selective bit line BL1 to be in off state. In the process illustrated in FIGS. 5A to 5C, in the above-mentioned state, the potential of the selective word line WL3 is set to the program potential (the third potential) Vpgm where the data is written in the memory cell MT3-1 corresponding to the selective bit line BL1 while maintaining the potential of the adjacent word lines WL2 and WL4 at the transfer potential Vpass and the potential of the non-adjacent word lines WL0, WL1, and WL5 to WL7 at the second potential Vd1.

By doing this, in the process illustrated in FIGS. 6A to 6C, the charge is hardly supplied from the channel region 60 of the non-adjacent memory cells MT0-1, MT1-1, and MT5-1 to MT7-1 to the channel region 60 of the selective memory cell MT3-1 so that the amount of charges which may be supplied to the channel region 60 of the selective memory cell MT3-1 may be restricted. In other words, it is possible to suppress the overmuch quantity of the charges from being written in the charge storage region 32 of the selective memory cell MT3-1. Therefore, the speed of writing data into the selective memory cell MT3-1 may be lowered in a self-limited process and the overwriting of the data into the selective memory cell MT3-1 may be prevented. As a result, it is possible to suppress the charges from passing through the tunnel insulating film 31 of the selective memory cell MT3-1 too much and to suppress the stress applied to the tunnel insulating film 31 of the selective memory cell MT3-1. Accordingly, the reliability of the various operations of the nonvolatile semiconductor memory device 100 may be improved.

Further, in the first embodiment, it is possible to suppress the overmuch quantity of charges from being written in the charge storage region 32 of the selective memory cell so that the variation of the thresholds Vth of the memory cells may be suppressed.

Further, in the first embodiment, when a multiple value of p bits (p is an integer of two or larger) is written in one memory cell, it is possible to suppress the overmuch quantity of charges from being written in the charge storage region 32 of the selective memory cell MT3-1 so that the overwriting until reaching the adjacent writing level may be suppressed. Further, an error (writing disturb) may be suppressed so that the reliability of the writing operation of the nonvolatile semiconductor memory device 100 may be improved.

Further, in the first embodiment, in processes subsequent to the process illustrated in FIGS. 4A to 4C, the adjacent word lines WL2 and WL4 which need to be maintained at the transfer potential (first potential) Vpass are adjacent at both sides of the selective word line WL3, respectively. By doing this, in the process illustrated in FIGS. 5A to 5C and the process illustrated in FIGS. 6A to 6C, it is possible to suppress the overmuch quantity of charges from being written in the charge storage region 32 of the selective memory cell MT3-1 and also possible to adequately adjust the quantity of charges to be written in the charge storage region 32 of the selective memory cell MT3-1.

Further, in the first embodiment, the potential of the select gate line SGD connected to the select gates DT-1 and DT-2 which are provided at the bit lines BL1 and BL2 of the NAND strings NS1 and NS2 is set to the potential Vdd in the process illustrated in FIGS. 3A to 3C and set to the potential Vd2 in the process subsequent to the process illustrated in FIGS. 4A to 4C. The potential Vdd is a potential that allows the select gate DT-1 at the drain side corresponding to the selective bit line BL1 to be in on state and the select gate DT-2 at the drain side corresponding to the non-selective bit line BL2 to be in off state. The potential Vd2 is a potential that allows the select gates DT-1 and DT-2 at the drain side to be in off state. By doing this, in the process illustrated in FIGS. 3A to 3C, it is possible to adequately set the channel potential Vch-1 of each of the memory cells MT0-1 to MT7-1 in the NAND string NS1 connected to the selective bit line BL1 and in the process subsequent to the process illustrated in FIGS. 4A to 4C, it is possible to surely disconnect the channel region 60 of the NAND string NS1 corresponding to the selective bit line BL1 from the selective bit line BL1 electrically.

Further, in the first embodiment, in the process illustrated in FIGS. 3A to 3C, the potential of the select gate line SGD is set to the potential Vdd so that the select gate DT-2 corresponding to the non-selective bit line BL2 becomes off state. By doing this, when the channel potential of each of the memory cells MT0-2 to MT7-2 in the NAND string NS2 corresponding to the non-selective bit line BL2 is set to a potential Vch-2' which is boosted so that the data is not written in a memory cell MT3-2 where the control gate 34 is connected to the selective word line WL3 when the potential of the selective word line WL3 is set to a program potential Vpgm (for example, 18 V). By doing this, it is possible to suppress the charge from being erroneously written in the non-selective memory cell.

Further, in the first embodiment, the potential Vdd of the select gate line SGD set in the process illustrated in FIGS. 3A to 3C, for example, is equivalent to the non-selective potential Vdd of the non-selective bit line BL2. By doing this, the select gate DT-1 at the drain side corresponding to the selective bit line BL1 may be in on state and the select gate DT-2 at the drain side corresponding to the non-selective bit line BL2 may be in off state.

Further, in the first embodiment, the potential Vd2 of the select gate line SGD set in the process subsequent to the process illustrated in FIGS. 4A to 4C, for example, is equivalent to the selective potential Vss of the bit line. By doing this, the select gates DT-1 and DT-2 at the drain side may be in off state.

It should be noted that the electrical disconnection of the channel region 60 of the selective memory cell MT3-1 from the selective bit line BL1, and the writing of data in the selective memory cell MT3-1 may be performed simultaneously or in parallel. For example, the operation illustrated in FIGS. 4A to 4C and the operation illustrated in FIGS. 5A to 5C may be simultaneously or in parallel performed. In other words, the potential of the selective word line WL3 may be set to the program potential (third potential) Vpgm (for example, 18 V) as illustrated in FIGS. 5A to 5C while the potential of non-adjacent word lines WL0, WL1, and WL5 to WL7 is set to the second potential Vd1 (for example, 0 V) as illustrated in FIGS. 4A to 4C.

Alternatively, the adjacent word line which needs to be maintained at the transfer potential (first potential) Vpass may be adjacent in plural at both sides of the selective word line. For example, instead of the process illustrated in FIGS. 4A to 4C and the process illustrated in FIGS. 5A to 5C, the process illustrated in FIGS. 8A to 8C and the process illustrated in FIGS. 9A to 9C may be performed. FIGS. 8A to 9C are views illustrating an operation of the memory cell array in the modified embodiment of the first embodiment.

Figure 8A:
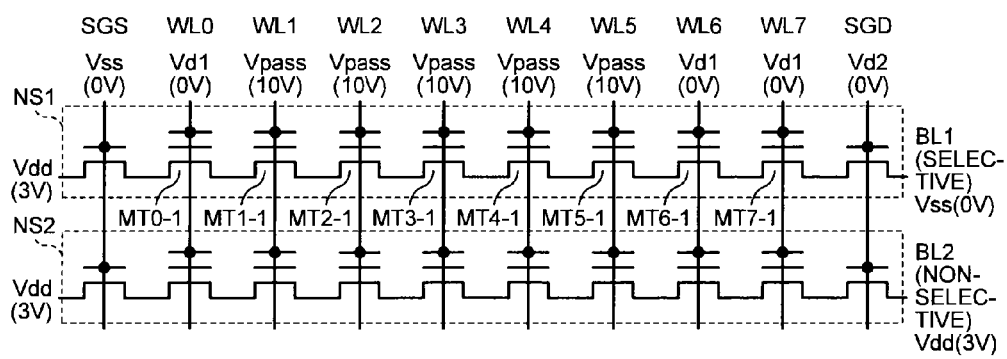
FIGS. 8A to 8C are views illustrating an operation of a memory cell array according to a modified embodiment of the first embodiment.
Figure 8B:
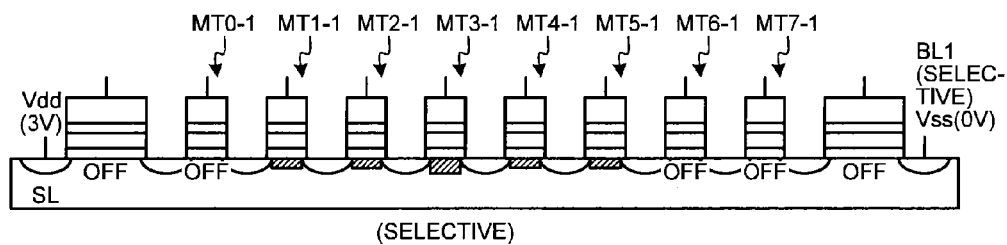
Figure 8C:
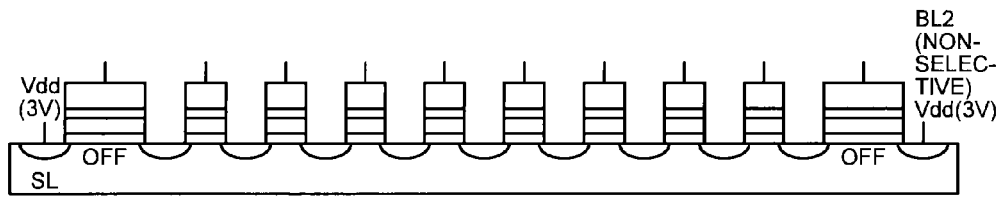

In the process illustrated in FIGS. 8A to 8C, a potentials of non-adjacent word lines WL0, WL6, and WL7 which are disposed outside the adjacent word lines WL1, WL2, WL4, and WL5 is set to a second potential Vd1 (for example, 0 V) while maintaining the potential of the selective word line WL3 corresponding to the selective memory cell MT3-1 and the potentials of the adjacent word lines WL1, WL2, WL4, and WL5 of which every two are adjacent at both sides of the selective word line WL3 at the transfer potential (first potential) Vpass. Further, the potential of the select gate line SGD at the drain side is dropped to the potential Vd2 (for example, dropped from 3 V to 0 V). Accordingly, in the NAND string NS1 corresponding to the selective bit line BL1, the non-adjacent memory cells MT0-1, MT6-1, and MT7-1 which are disposed outside the adjacent memory cells MT1-1, MT2-1, MT4-1, and MT5-1 and the select gate DT-1 are in off state while maintaining the selective memory cell MT3-1 and the adjacent memory cells MT1-1, MT2-1, MT4-1, and MT5-1 adjacent thereto in on state, and the channel region 60 of the selective memory cell MT3-1 is electrically disconnected from the selective bit line BL1.

Figure 9A:
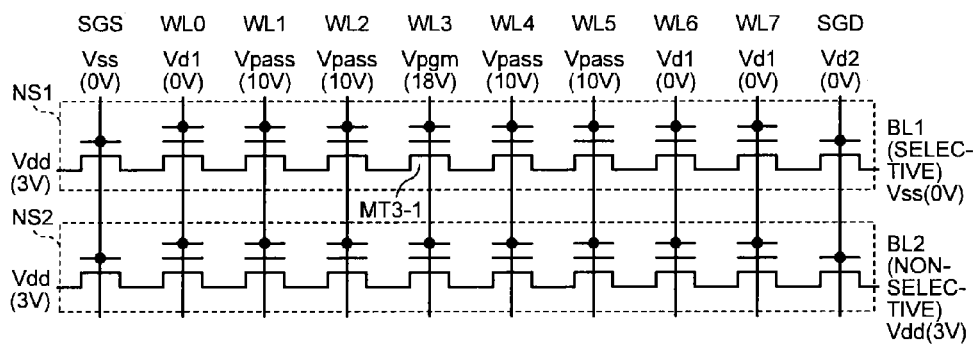
FIGS. 9A to 9C are views illustrating an operation of the memory cell array according to the modified embodiment of the first embodiment.
Figure 9B:
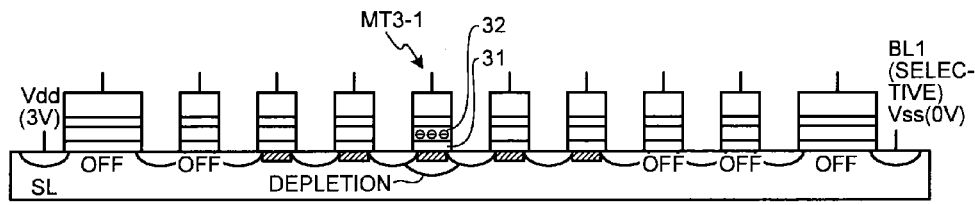
Figure 9C:
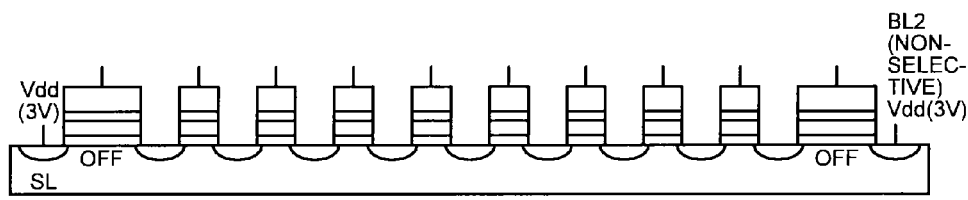

In the process illustrated in FIGS. 9A to 9C, the potential of the selective word line WL3 is set to the program potential (third potential) Vpgm (for example, 18 V) while maintaining the potential of the adjacent word lines WL1, WL2, WL4, and WL5 at the transfer potential (first potential) Vpass (for example, 10 V) and maintaining the potential of the non-adjacent word lines WL0, WL6, and WL7 to the second potential Vd1. By doing this, in the NAND string NS1 corresponding to the selective bit line BL1, data is written in the selective memory cell MT3-1 by writing the charge in the charge storage region 32 through the tunnel insulating film 31 from the channel region 60. In the meantime, in the NAND string NS2 corresponding to the non-selective bit line BL2, the select gate DT-2 at the drain side is in off state and the channel potential of each of the memory cells MT0-2 to MT7-2 is a potential Vch-2' boosted so that the data is not written in the memory cell MT3-2 where the control gate 34 is connected to the selective word line WL3. Therefore, a channel of the charge (for example, electron) is not formed and data is not written.

As described above, in the process subsequent to the process illustrated in FIGS. 8A to 8C, the adjacent word lines WL1, WL2, WL4, and WL5 which need to be maintained at the transfer potential (first potential) Vpass are adjacent in plural at both sides of the selective word line WL3. Therefore, in the process illustrated in FIGS. 9A to 9C, it is possible to suppress the overmuch quantity of charges from being written in the charge storage region 32 of the selective memory cell MT3-1 and also possible to adequately adjust the quantity of charges to be written in the charge storage region 32 of the selective memory cell MT3-1.

Alternatively, for example, in setting the potential of the non-adjacent word line to the second potential Vd1, if there is no word line which is adjacent to one side of the selective word line, a word line which is adjacent to the other side of the selective word line may be used as an adjacent word line to maintain the potential of the adjacent word line at the transfer potential Vpass. For example, if the memory cell MT0-1 is a selective memory cell, in the selective word line WL0 corresponding to the selective memory cell MT0-1, no word line which is adjacent to the source side exists. In this case, for example, instead of the process illustrated in FIGS. 4A to 4C and the process illustrated in FIGS. 5A to 5C, the process illustrated in FIGS. 10A to 10C and the process illustrated in FIGS. 11A to 11C may be performed. FIGS. 10A to 11C are views illustrating an operation of the memory cell array in another modified embodiment of the first embodiment.

In the process illustrated in FIGS. 3A to 3C, the potential of the select gate line SGS at the source side is set to a potential that allows the select gates ST-1 and ST-2 at the source side to be in off state, for example, a ground potential Vss (for example, 0 V). Accordingly, the select gates ST-1 and ST-2 at the source side become off state and the memory cells MT0-1 to MT7-1 and MT0-2 to MT7-2 and the common source line SL are disconnected electrically.

Figure 10A:
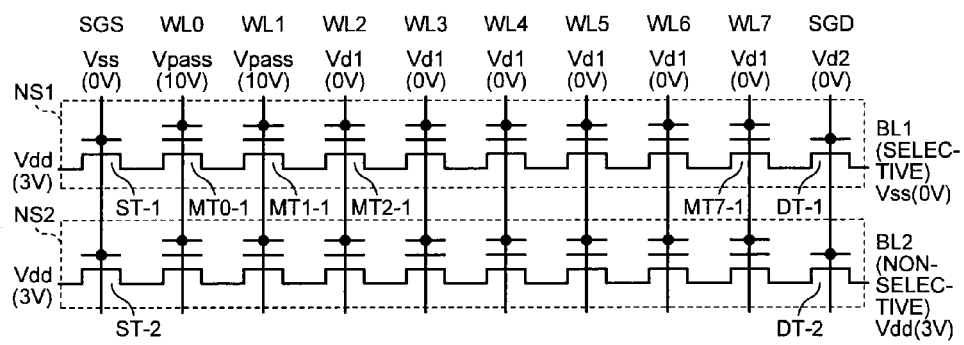
FIGS. 10A to 10C are views illustrating an operation of a memory cell array according to another modified embodiment of the first embodiment.
Figure 10B:
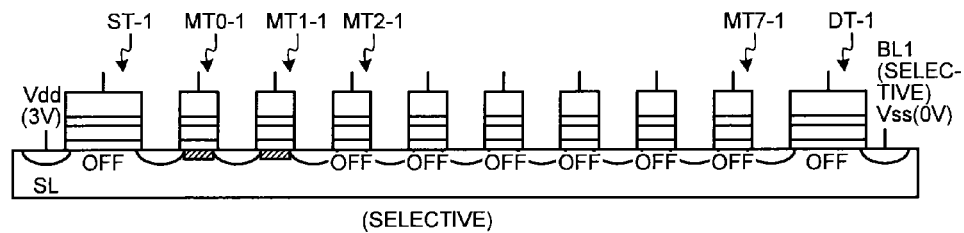
Figure 10C:
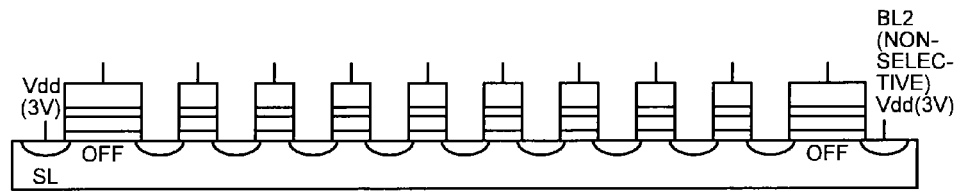

In the process illustrated in FIGS. 10A to 10C, the potential of the non-adjacent word lines WL2 to WL7 which are disposed outside the adjacent word line WL1 is set to the second potential Vd1 (for example, 0 V) while maintaining the potential of the selective word line WL0 corresponding to the selective memory cell MT0-1 and the potential of the adjacent word line WL1, for example, one of which is adjacent to the drain side of the selective word line WL0 at the transfer potential (first potential) Vpass. Further, the potential of the select gate line SGD at the drain side is dropped to the potential Vd2 (for example, dropped from 3 V to 0 V). By doing this, in the NAND string NS1 corresponding to the selective bit line BL1, the non-adjacent memory cells MT2-1 to MT7-1 which are disposed outside the adjacent memory cells MT1-1 and the select gate DT-1 are in off state while maintaining the selective memory cell MT0-1 and the adjacent memory cell MT1-1 adjacent thereto in on state, and the channel region 60 of the selective memory cell MT0-1 is electrically disconnected from the selective bit line BL1.

Figure 11A:
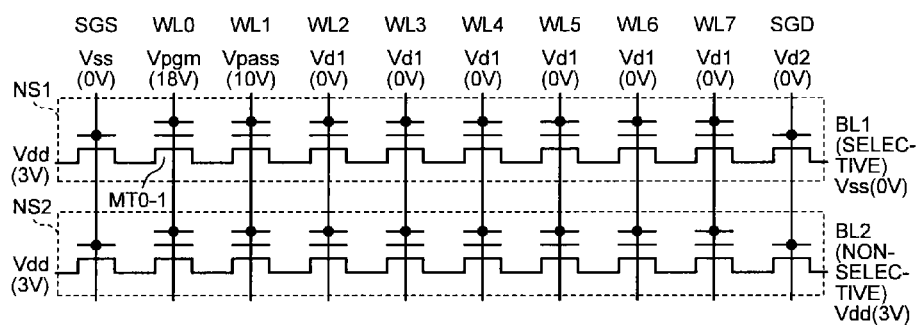
FIGS. 11A to 11C are views illustrating an operation of a memory cell array according to another modified embodiment of the first embodiment.
Figure 11B:
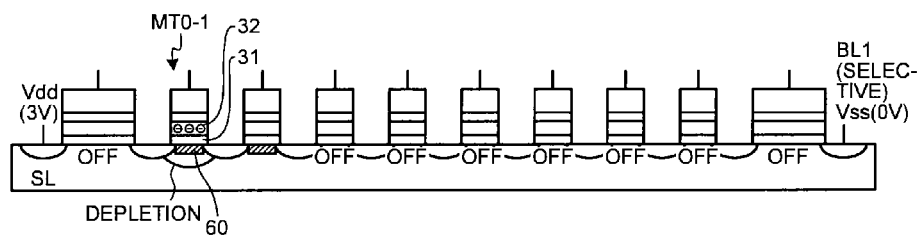
Figure 11C:
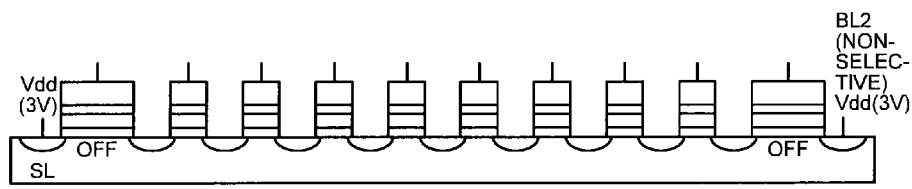

In the process illustrated in FIGS. 11A to 11C, the potential of the selective word line WL0 is set to the program potential (third potential) Vpgm (for example, 18 V) while maintaining the potential of the adjacent word line WL1 at the transfer potential (first potential) Vpass (for example, 10 V) and maintaining the potential of the non-adjacent word lines WL2 to WL7 at the second potential Vd1. By doing this, in the NAND string NS1 corresponding to the selective bit line BL1, data is written in the selective memory cell MT0-1 by writing the charge in the charge storage region 32 through the tunnel insulating film 31 from the channel region 60. In the meantime, the NAND string NS2 corresponding to the non-selective bit line BL2, the select gate DT-2 at the drain side becomes in off state and the channel potential of each of the memory cells MT0-2 to MT7-2 is a potential Vch-2' boosted so that the data is not written in the memory cell MT0-2 where the control gate 34 is connected to the selective word line WL0. Therefore, a channel of the charge (for example, electron) is not formed and data is not written.

As described above, in the setting of the potential of the non-adjacent word line to the second potential Vd1, even when there is no word line which is adjacent to one side of the selective word line, a potential of the select gate line which is adjacent to the one side of the selective word line is appropriately set and the select gate adjacent to the selective memory cell becomes off state so that it is possible to suppress the overmuch quantity of charges from being written in the charge storage region 32 of the selective memory cell MT0-1 and appropriately adjust the quantity of charges to be written in the charge storage region 32 of the selective memory cell MT0-1.

(Second Embodiment)

Next, a writing method of a nonvolatile semiconductor memory device according to a second embodiment will be described with reference to FIGS. 12A to 16C. FIGS. 12A to 16C are views illustrating an operation of the memory cell array according to the second embodiment. Hereinafter, different parts from the first embodiment will be mainly described.

In the first embodiment, an operation when each of the memory cells includes a source region and a drain region has been illustrated. In the second embodiment, an operation when each of the memory cells does not have the source region and the drain region will be illustrated.

Figure 12A:
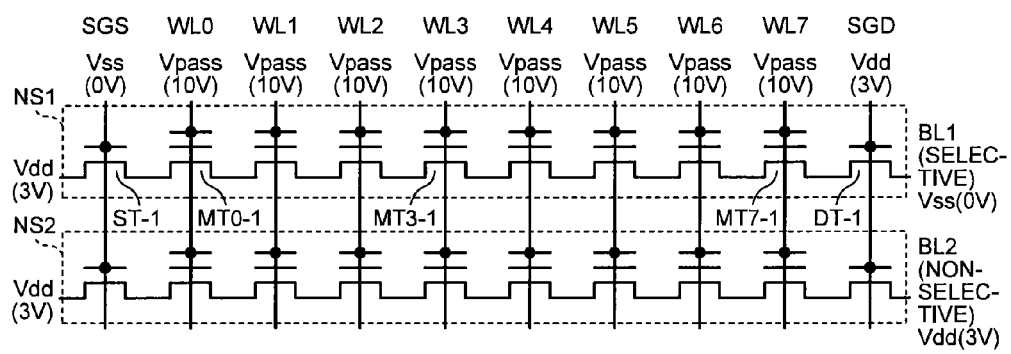
FIGS. 12A to 12C are views illustrating an operation of a memory cell array according to a second embodiment.
Figure 12B:
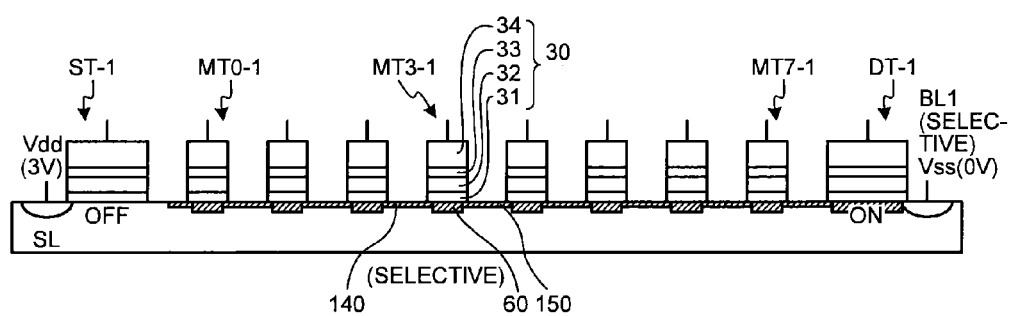

Specifically, each of the memory cells MT0 to MT7 (see FIG. 2), for example, as illustrated in FIG. 12B, has a gate electrode 30 in which a tunnel insulating film 31, a charge storage region 32, an insulating film 33, and a control gate 34 are stacked in this order on the semiconductor substrate SB and has a channel region 60 below the gate electrode 30 in the semiconductor substrate SB. However, each of the memory cells does not have a source region 40 and a drain region 50 (see FIG. 3B) at both sides of the channel region 60 in the semiconductor substrate SB.

For example, if a charge (for example, electron) to be written in the charge storage region 32 corresponds to a first conductive type (for example, an N type), the memory cells MT0 to MT7, for example, are transistors corresponding to the first conductive type (for example, Nch transistor). In this case, the channel region 60 is formed of a semiconductor (for example, silicon) containing impurity (for example, boron) of a second conductive type (for example, P type) which is a conductive type opposite to the first conductive type. Also the regions 140 and 150 at both sides of the channel region 60 in the semiconductor substrate SB are formed of a semiconductor (for example, silicon) containing a second conductive type (for example, P type) impurity (for example, boron) at a concentration similar to that of the channel region 60.

Further, in the second embodiment, instead of the control illustrated in FIGS. 3A to 6C, the control as illustrated in FIGS. 12A to 16C may be performed.

Figure 12C:
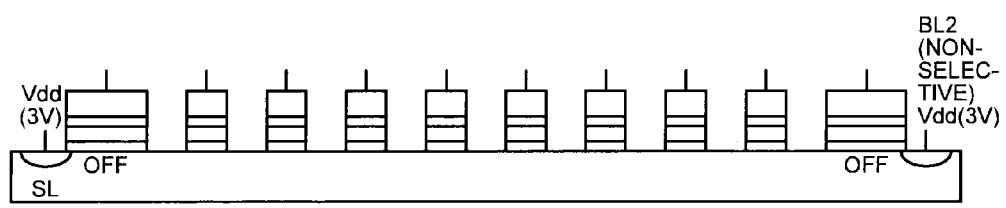

In the process illustrated in FIGS. 12A to 12C, similarly to the process illustrated in FIGS. 3A to 3C, the potential of the selective bit line BL1 corresponding to the selective memory cell MT3-1 is set to the selective potential Vss (for example, 0 V) and the potential of the non-selective bit line BL2 is set to the non-selective potential Vdd (for example, 3 V). In this state, the potentials of all of the plurality of word lines WL0 to WL7 are set to the transfer potential (first potential) Vpass (for example, 10 V).

By doing this, in the NAND strings NS1 including the selective memory cell MT3-1, each of the memory cells MT0-1 to MT7-1 is connected to the selective bit line BL1. Therefore, a channel potential Vch-1 of each of the memory cells MT0-1 to MT7-1 between the two select gates ST-1 and DT-1 uniformly becomes a selective potential Vss (for example, 0 V) of the selective bit line BL1. In other words, charge to be written in the selective memory cell MT3-1 is supplied from the selective bit line BL1 into a channel region 60 of each of the memory cells MT0-1 to MT7-1 of the NAND string NS1 including the selective memory cell MT3-1.

In this case, since each of the memory cells MT0 to MT7 does not have the source region 40 and the drain region 50, the quantity of charges which are supplied to the channel region 60 of each of the memory cells MT0-1 to MT7-1 may be smaller than that of the first embodiment.

Figure 13A:
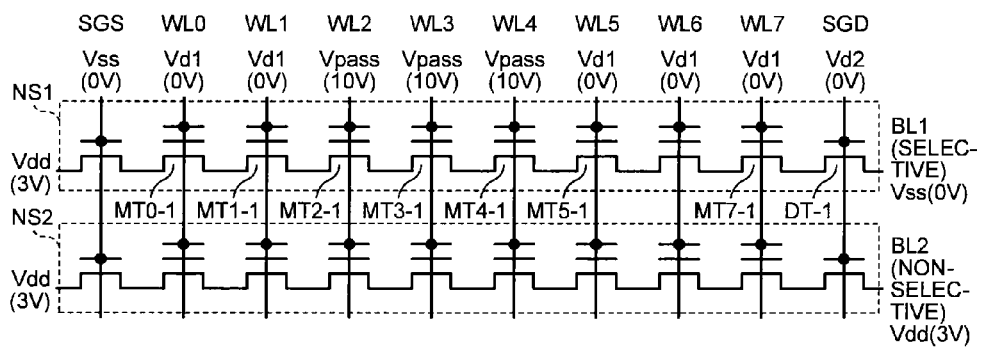
FIGS. 13A to 13C are views illustrating an operation of the memory cell array according to the second embodiment.
Figure 13B:
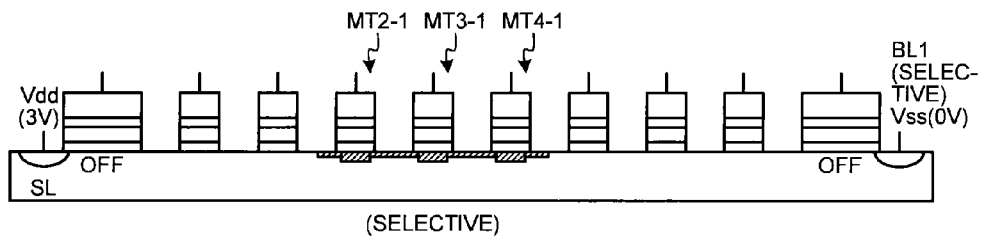
Figure 13C:
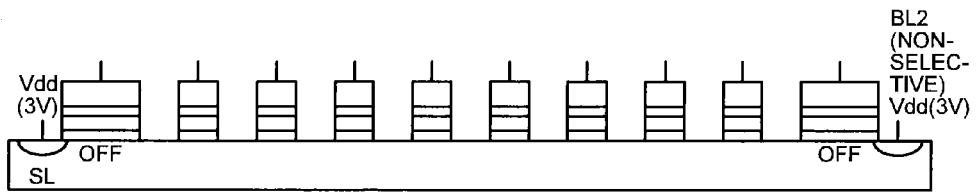

In the process illustrated in FIGS. 13A to 13C, similarly to the process illustrated in FIGS. 4A to 4C, potentials of non-adjacent word lines WL0, WL1, and WL5 to WL7 which are disposed outside the adjacent word lines WL2 and WL4 are set to a second potential Vd1 (for example, 0 V) while maintaining a potential of the selective word line WL3 corresponding to the selective memory cell MT3-1 and potentials of adjacent word lines WL2 and WL4 which are adjacent at both sides of the selective word line WL3, respectively at the transfer potential (first potential) Vpass. Further, the potential of the selective gate line SGD at the drain side is dropped to a potential which allows the select gates DT-1 and DT-2 at the drain side to be in off state, for example, a potential Vd2 equivalent to the selective potential Vss of the selective bit line BL1 (for example, dropped from 3 V to 0 V).

By doing this, in the NAND string NS1 corresponding to the selective bit line BL1, while maintaining the selective memory cell MT3-1 and adjacent memory cells MT2-1 and MT4-1 adjacent thereto in on state, the non-adjacent memory cells MT0-1, MT1-1, and MT5-1 to MT7-1 which are disposed outside the adjacent memory cells MT2-1 and MT4-1 and the select gate DT-1 are in off state and the channel region 60 of the selective memory cell MT3-1 is electrically disconnected from the selective bit line BL1.

In this case, since each of the memory cells MT0 to MT7 does not have the source region 40 and the drain region 50, the quantity of charges which remain in the channel region 60 of the selective memory cell MT3-1 and the adjacent memory cells MT2-1 and MT4-1 adjacent thereto may be smaller than that of the first embodiment.

Figure 14A:
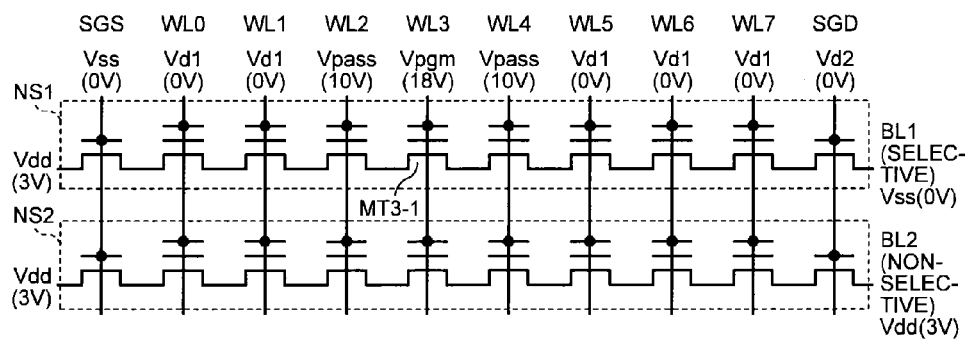
FIGS. 14A to 14C are views illustrating an operation of the memory cell array according to the second embodiment.
Figure 14B:
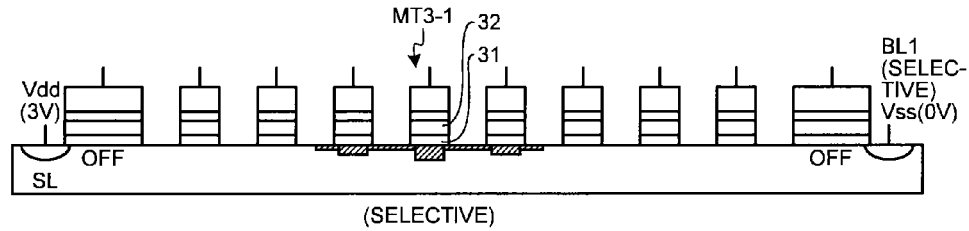
Figure 14C:
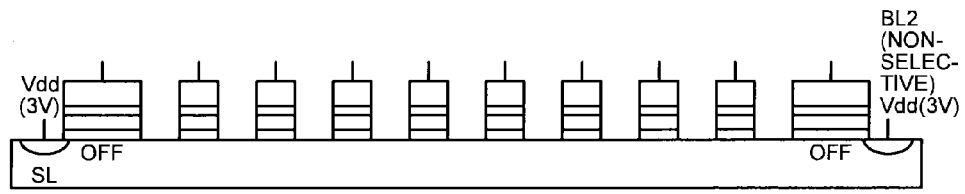

In the process illustrated in FIGS. 14A to 14C, similarly to the process illustrated in FIGS. 5A to 5C, the potential of the selective word line WL3 is set to be a program potential (third potential) Vpgm (for example, 18 V) while maintaining the potential of the adjacent word lines WL2 and WL4 at the transfer potential (first potential) Vpass (for example, 10 V) and the potentials of the non-adjacent word lines WL0, WL1, WL5 to WL7 at the second potential Vd1.

By doing this, in the NAND string NS1 corresponding to the selective bit line BL1, in the selective memory cell MT3-1, the charge is written from the channel region 60 through the tunnel insulating film 31 in the charge storage region 32 so that data is written in the selective memory cell MT3-1.

Figure 15A:
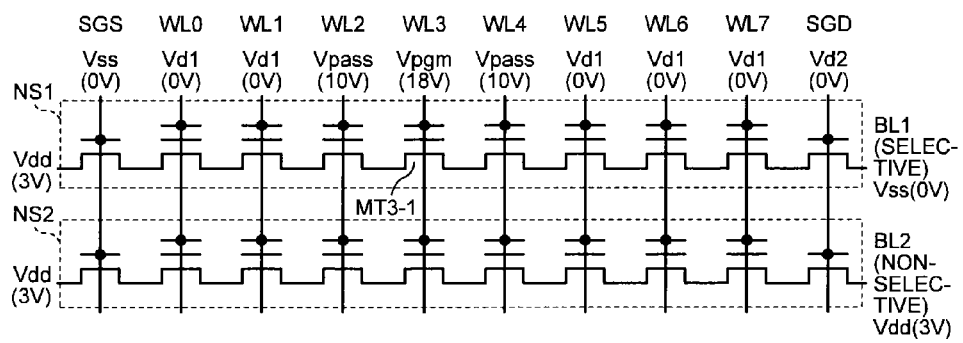
FIGS. 15A to 15C are views illustrating an operation of the memory cell array according to the second embodiment.
Figure 15B:
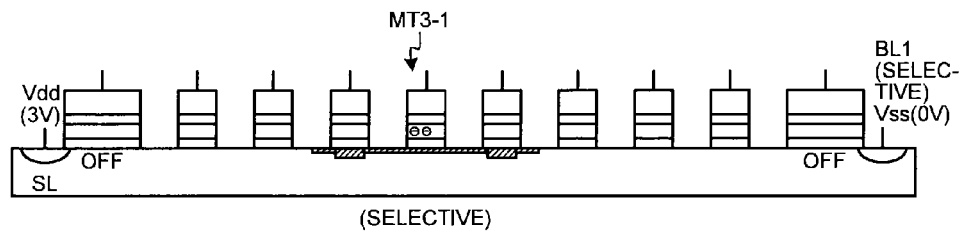
Figure 15C:
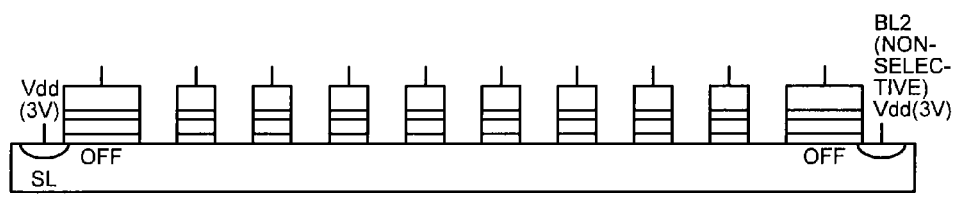

In the process illustrated in FIGS. 15A to 15C, the writing speed of the data in the selective memory cell MT3-1 is lowered in a self-limited process.

In this case, since each of the memory cells MT0 to MT7 does not have the source region 40 and the drain region 50, the quantity of charges which may be supplied to the channel region 60 of the selective memory cell MT3-1 may be further restricted and the writing speed of data in the selective memory cell MT3-1 may be further sharply lowered in a self-limited process, as compared with the first embodiment.

In the meantime, the quantity of charges which remain in the channel region 60 of the selective memory cell MT3-1 may be smaller than that of the first embodiment, which may be insufficient as compared with the target quantity of charges to be written in the charge storage region 32.

Figure 16A:
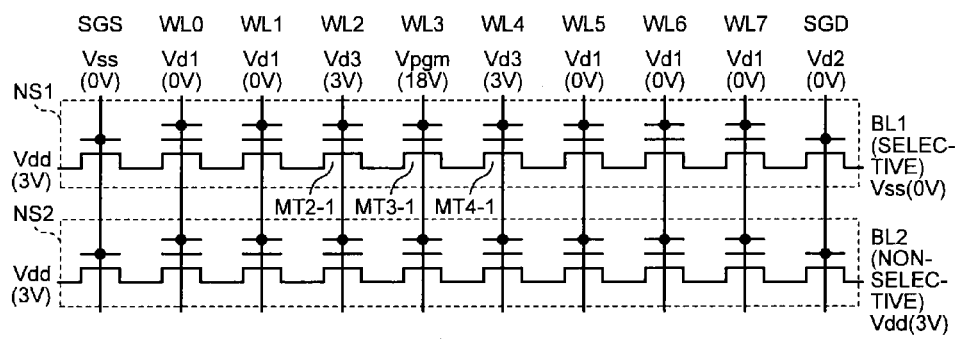
FIGS. 16A to 16C are views illustrating an operation of the memory cell array according to the second embodiment.
Figure 16B:
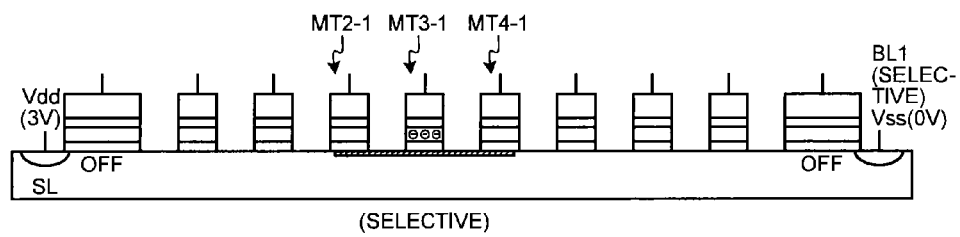
Figure 16C:
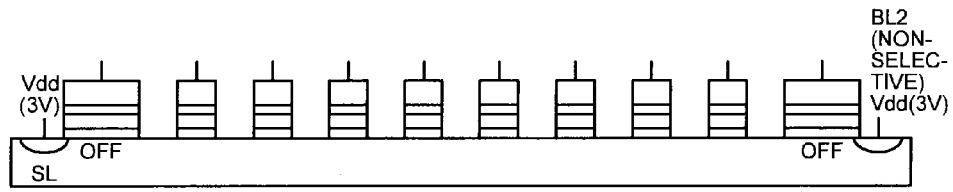
Figure 17A:
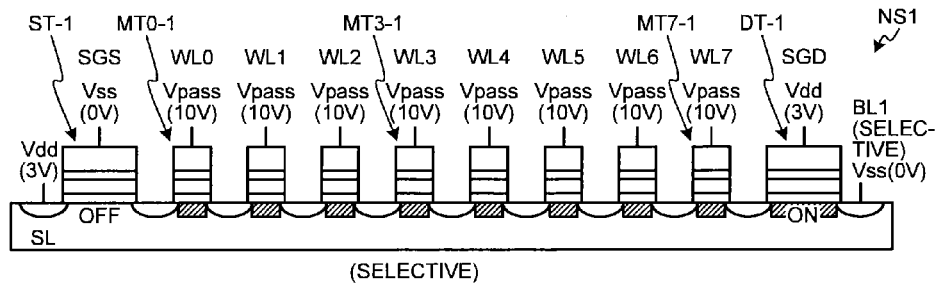
FIGS. 17A to 17D are views illustrating an operation of a memory cell array according to a third embodiment.
Figure 17B:
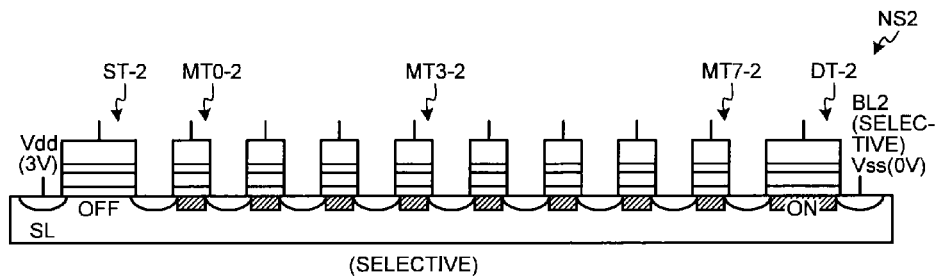
Figure 17C:
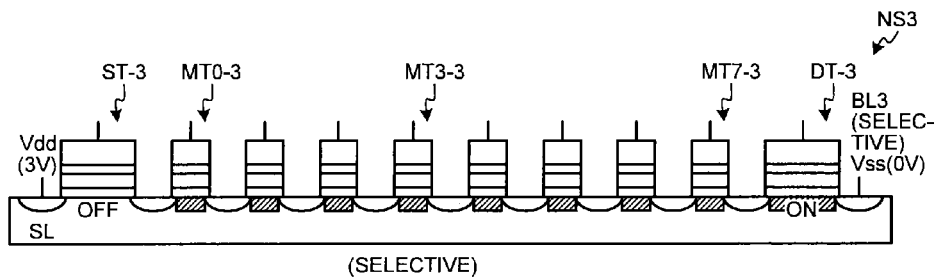
Figure 17D:
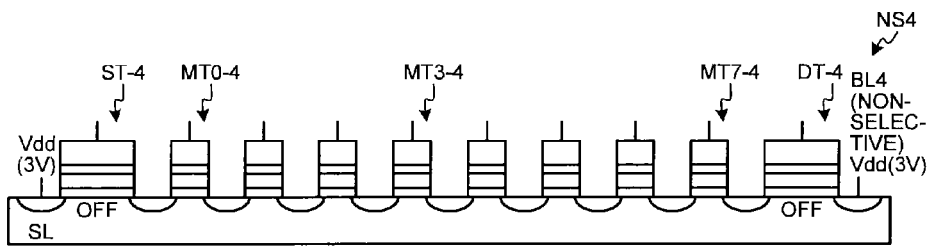
Figure 18A:
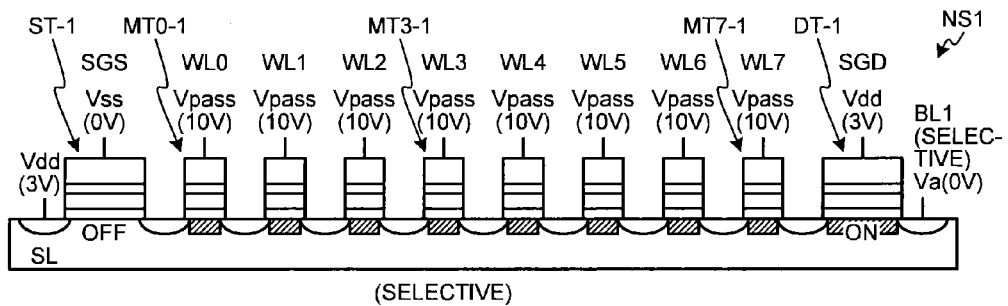
FIGS. 18A to 18D are views illustrating an operation of the memory cell array according to the third embodiment.
Figure 18B:
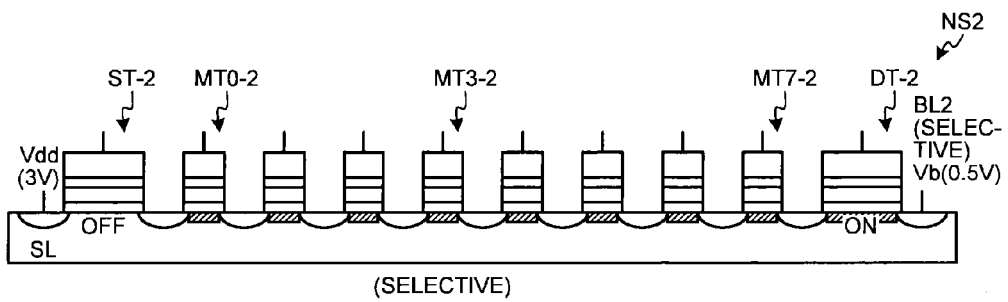
Figure 18C:
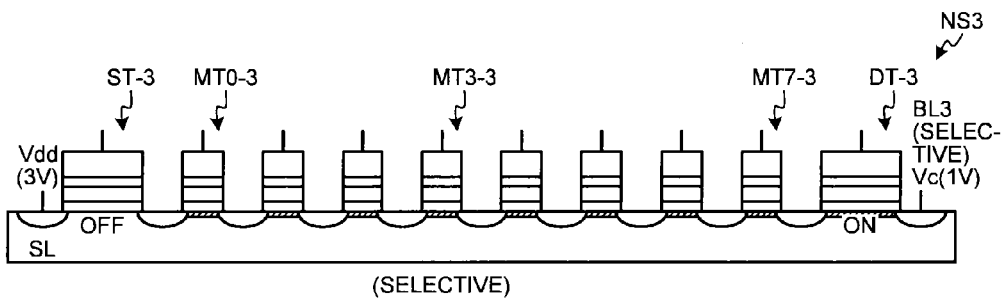
Figure 18D:
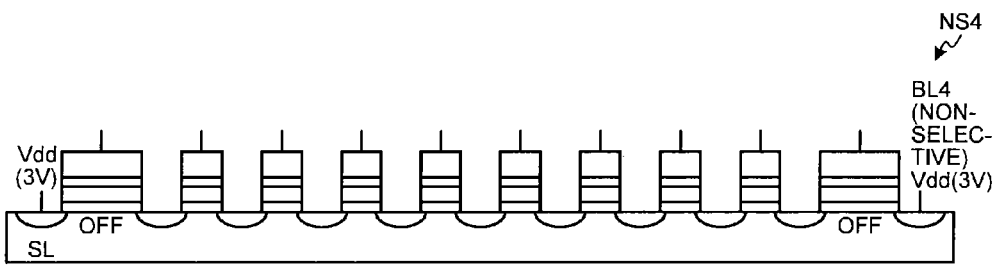

Here, in the process illustrated in FIGS. 16A to 16C, the charges (for example, electrons) from the channel region 60 of the adjacent memory cells MT2-1 and MT4-1 are supplemented in the channel region 60 of the selective memory cell MT3-1. In other words, the potentials of the adjacent word lines WL2 and WL4 are set to a fourth potential Vd3 while maintaining the potential of the selective word line WL3 at the program potential (third potential) Vpgm and the potentials of the non-adjacent word lines WL0, WL1, and WL5 to WL7 at the second potential Vd1. The fourth potential Vd3 is a potential between the transfer potential (first potential) Vpass and the second potential Vd1, for example, 3 V.

By doing this, the charges which remain in the channel region 60 of the adjacent memory cells MT2-1 and MT4-1 may be transferred to the channel region 60 of the selective memory cell MT3-1, thus supplementing the insufficient quantity of charges to be written in the charge storage region 32.

As described above, in the second embodiment, since each of the memory cells MT0 to MT7 does not have the source region 40 and the drain region 50, when the writing speed of data into the selective memory cell MT3-1 in the process illustrated in FIGS. 15A to 15C is lowered in a self-limited process, as compared with the first embodiment, the amount of the charges which may be supplied to the channel region 60 of the selective memory cell MT3-1 may be further restricted and the writing speed of data into the selective memory cell MT3-1 may be further sharply lowered in a self-limited process. Accordingly, it is possible to efficiently prevent the data from being overwritten in the selective memory cell MT3-1.

Further, in the second embodiment, in the process illustrated in FIGS. 16A to 16C, the potentials of the adjacent word lines WL2 and WL4 are set to a fourth potential Vd3 while maintaining the potential of the selective word line WL3 at the program potential (third potential) Vpgm and maintaining the potentials of the non-adjacent word lines WL0, WL1, and WL5 to WL7 at the second potential Vd1. Accordingly, the charges which remain in the channel region 60 of the adjacent memory cells MT2-1 and MT4-1 may be transferred to the channel region 60 of the selective memory cell MT3-1 and the insufficient quantity of charges to be written in the charge storage region 32 may be supplemented.

Therefore, it is possible to prevent the insufficiency of the data to be written in the selective memory cell MT3-1.

Further, in the second embodiment, it is possible to efficiently prevent the data from being overwritten in the selective memory cell MT3-1 and to prevent the insufficiency of the data to be written in the selective memory cell MT3-1. Therefore, it is possible to suppress the variation of the threshold Vth of the selective memory cell MT3-1.

It should be noted that the electrical disconnection of the channel region 60 of the selective memory cell MT3-1 from the selective bit line BL1, and writing of data in the selective memory cell MT3-1 may be performed simultaneously or in parallel. For example, the operation illustrated in FIGS. 13A to 13C and the operation illustrated in FIGS. 14A to 14C may be performed simultaneously or in parallel. In other words, the potential of the selective word line WL3 may be set to the program potential (third potential) Vpgm (for example, 18 V) as illustrated in FIGS. 14A to 14C while setting the potentials of non-adjacent word lines WL0, WL1, and WL5 to WL7 to the second potential Vd1 (for example, 0 V) as illustrated in FIGS. 13A to 13C.

Alternatively, writing data in the selective memory cell MT3-1, and the supplementation of the charge from the channel region 60 of the adjacent memory cells MT2-1 and MT4-1 to the channel region 60 of the selective memory cell MT3-1 may be performed simultaneously or in parallel. For example, the operation illustrated in FIGS. 14A to 14C and the operation illustrated in FIGS. 16A to 16C may be performed simultaneously or in parallel. In other words, the potentials of the adjacent word lines WL2 and WL4 may be set to the fourth potential Vd3 (for example, 3 V) while setting the potential of the selective word line WL3 to the program potential (third potential) Vpgm (for example, 18 V) as illustrated in FIGS. 14A to 14C.

Alternatively, the electrical disconnection of the channel region 60 of the selective memory cell MT3-1 from the selective bit line BL1, writing data in the selective memory cell MT3-1, and the supplementation of the charge from the channel region 60 of the adjacent memory cells MT2-1 and MT4-1 to the channel region 60 of the selective memory cell MT3-1 may be performed simultaneously or in parallel. For example, the operation illustrated in FIGS. 13A to 13C, the operation illustrated in FIGS. 14A to 14C, and the operation illustrated in FIGS. 16A to 16C may be performed simultaneously or in parallel. In other words, the potentials of the adjacent word lines WL2 and WL4 may be set to the fourth potential Vd3 (for example, 3 V) while setting the potential of the non-adjacent word lines WL1, WL1, and WL5 to WL7 to the second potential Vd1 (for example, 0 V) as illustrated in FIGS. 13A to 13C and setting the potential of the selective word line WL3 to the program potential (third potential) Vpgm (for example, 18 V) as illustrated in FIGS. 14A to 14C.

(Third Embodiment)

Next, a writing method of a nonvolatile semiconductor memory device according to a third embodiment will be described with reference to FIGS. 17A to 21D. FIGS. 17A to 21D are views illustrating an operation of the memory cell array according to the third embodiment. Hereinafter, different parts from the first embodiment will be mainly described.

In the first embodiment, the operation of one selective bit line among the plurality of bit lines has been illustrated. In the third embodiment, an operation of multiple selective bit lines among the plurality of bit lines will be illustrated. For example, a case where quaternary (2 bits) is written in one memory cell will be illustrated. Here, the quaternary is formed of three kinds of cells that change the threshold Vth by changing the quantity of charges to be written and one kind of cell which is in the erased state.

Specifically, instead of the control illustrated in FIGS. 3A to 6C, the control as illustrated in FIGS. 17A to 21D may be performed.

In the process illustrated in FIGS. 17A to 17D, a channel potential of each of the memory cells in NAND strings including the selective memory cells is set to a selective potential of the bit line. That is, a potential of a selective bit line BL1 corresponding to a selective memory cell MT3-1 is set to the selective potential Vss (for example, 0 V), a potential of a selective bit line BL2 corresponding to a selective memory cell MT3-2 is set to a selective potential Vss (for example, 0 V), a potential of a selective bit line BL3 corresponding to a selective memory cell MT3-3 is set to a selective potential Vss (for example, 0 V), and a potential of a non-selective bit line BL4 is set to a non-selective potential Vdd (for example, 3 V).

In this state (first bit line potential setting state), the potential of all of the plurality of word lines WL0 to WL7 is set to a transfer potential (first potential) Vpass (for example, 10 V). Further, a potential of a select gate line SGD at a drain side is raised to a potential that allows select gates DT-1 to DT-3 at the drain side corresponding to the selective bit lines BL1 to BL3 to be in on state and allows select gate DT-4 at the drain side corresponding to the non-selective bit line BL4 to be in off state, for example, a potential Vdd which is equivalent to the non-selective bit line BL4 (for example, raised from 0 V to 3 V).

In the meantime, the potential of a select gate line SGS at a source side is set to a potential which allows select gates ST-1 to ST-4 at the source side to be in off state, for example, a ground potential Vss (for example, 0 V). In other words, the select gates ST-1 to ST-4 at the source side become off state and the memory cells MT0-1 to MT7-1, MT0-2 to MT7-2, MT0-3 to MT7-3, and MT0-4 to MT7-4 are disconnected from a common source line SL.

In this case, in the NAND strings NS1, NS2, and NS3 including the selective memory cells MT3-1, MT3-2, and MT3-3, since the memory cells MT0-1 to MT7-1, MT0-2 to MT7-2, and MT0-3 to MT7-3 are connected to the corresponding selective bit lines BL1, BL2, and BL3, the channel potentials Vch-1, Vch-2, and Vch-3 of the memory cells MT0-1 to MT7-1, MT0-2 to MT7-2, and MT0-3 to MT7-3 uniformly become the selective potential Vss (for example, 0 V) of the selective bit lines BL1, BL2, and BL3. In other words, charge group including charges to be written in the selective memory cells MT3-1, MT3-2, and MT3-3 is supplied from the selective bit lines BL1, BL2, and BL3 to a channel regions 60 of the memory cells MT0-1 to MT7-1, MT0-2 to MT7-2, and MT0-3 to MT7-3 of the NAND strings NS1, NS2, and NS3 including the selective memory cells MT3-1, MT3-2, and MT3-3.

In the meantime, in the NAND string NS4 corresponding to the non-selective bit line BL4, since the memory cells MT0-4 to MT7-4 are connected to the non-selective bit line BL4. Therefore, a non-selective potential Vdd (for example, 3 V) of the non-selective bit line BL4 is supplied to the channel regions 60 of the memory cells MT0-4 to MT7-4 between two select gates ST-4 and DT-4. If a threshold of the select gate DT-4 (transistor) to which a back bias is applied is Vth_sgd (for example, 1 V), when a channel potential Vch-4 of the memory cells MT0-4 to MT7-4 reaches Vdd-Vth_sgd (for example, 2 V), the select gate DT-4 at the drain side becomes in off state. For an actual operation time, the charges (for example, electrons) are not substantially supplied above the threshold no longer, and the channel of the charge (for example, electron) is not formed. Therefore, the channel potential Vch-4 of the memory cells MT0-4 to MT7-4 is further raised (boosted) by a capacitive coupling with the word lines WL0 to WL7 whose potential is raised to the transfer potential Vpass. In other words, the channel potential of the memory cells MT0-4 to MT7-4 corresponding to the non-selective bit line BL4 is set to a potential Vch-4' which is boosted so that the data is not written in a memory cell MT3-4 corresponding to the non-selective bit line BL4 where the control gate 34 is connected to the selective word line WL3 when the potential of the selective word line WL3 is set to a program potential Vpgm (for example, 18 V) which will be described below.

In the process illustrated in FIGS. 18A to 18D, a channel potential of each of the memory cells in the NAND string including the selective memory cell is set to a selective potential for every bit line. In other words, the potential of the selective bit line BL1 corresponding to the selective memory cell MT3-1 is set to the first selective potential Va (for example, 0 V), the potential of the selective bit line BL2 corresponding to the selective memory cell MT3-2 is set to the second selective potential Vb (for example, 0.5 V), the potential of the selective bit line BL3 corresponding to the selective memory cell MT3-3 is set to the third selective potential Vc (for example, 1 V), and the potential of the non-selective bit line BL4 is set to the non-selective potential Vdd (for example, 3 V) while maintaining the potential of all of the plurality of word lines WL0 to WL7 at the transfer potential (first potential) Vpass (for example, 10 V).

That is, in this state (second bit line potential setting state), the potential of all of the plurality of word lines WL0 to WL7 is continuously set to the transfer potential (first potential) Vpass (for example, 10 V).

In this case, in the NAND string NS1 including the selective memory cell MT3-1, since the memory cells MT0-1 to MT7-1 are connected to the selective bit line BL1, channel potentials Vch-1 of the memory cells MT0-1 to MT7-1 between two select gates ST-1 and DT-1 uniformly become the first selective potential Va (for example, 0 V). In other words, the quantity of charges which remain in the channel region 60 of the memory cells MT0-1 to MT7-1 is adjusted according to a threshold level to be written in the selective memory cell MT3-1.

In the NAND string NS2 including the selective memory cell MT3-2, since the memory cells MT0-2 to MT7-2 are connected to the selective bit line BL2, the channel potentials Vch-2 of the memory cells MT0-2 to MT7-2 between the two select gates ST-2 and DT-2 uniformly become the second selective potential Vb (for example, 0.5 V). In other words, the quantity charges which remain in the channel region 60 of the memory cells MT0-2 to MT7-2 is adjusted according to the threshold level to be written in the selective memory cell MT3-2.

In the NAND string NS3 including the selective memory cell MT3-3, since the memory cells MT0-3 to MT7-3 are connected to the selective bit line BL3, the channel potentials Vch-3 of the memory cells MT0-3 to MT7-3 between the two select gates ST-3 and DT-3 uniformly become the third selective potential Vc (for example, 1 V). In other words, the quantity charges which remain in the channel region 60 of the memory cells MT0-3 to MT7-3 is adjusted according to the threshold level to be written in the selective memory cell MT3-3.

In the process illustrated in FIGS. 19A to 19D, the channel regions 60 of the selective memory cells MT3-1, MT3-2, and MT3-3 are electrically blocked from the selective bit lines BL1, BL2, and BL3. That is, the potential of the non-adjacent word lines WL0, WL1, and WL5 to WL7 which are disposed outside the adjacent word lines WL2 and WL4 is set to the second potential Vd1 (for example, 0 V) while maintaining a potential of the selective word line WL3 commonly corresponding to the selective memory cells MT3-1, MT3-2, and MT3-3 and the potential of the adjacent word lines WL2 and WL4 which are adjacent at both sides of the selective word line WL3, respectively at the transfer potential (first potential) Vpass. Further, the potential of the select gate line SGD at the drain side is dropped to a potential that allows the select gates DT-1 to DT-4 at the drain side to be in off state, for example, a potential Vd2 equivalent to the selective potential Va of the selective bit line BL1 (for example, dropped from 3 V to 0 V).

By doing this, in the NAND string NS1 corresponding to the selective bit line BL1, while maintaining the selective memory cell MT3-1 and adjacent memory cells MT2-1 and MT4-1 adjacent thereto in on state, the non-adjacent memory cells MT0-1, MT1-1, and MT5-1 to MT7-1 which are disposed outside the adjacent memory cells MT2-1 and MT4-1 and the select gate DT-1 are in off state and the channel region 60 of the selective memory cell MT3-1 is electrically disconnected from the selective bit line BL1. In other words, the non-adjacent memory cells MT0-1, MT1-1, and MT5-1 to MT7-1 are in off state while maintaining the channel potential Vch-1 of the selective memory cell MT3-1 at the first selective potential Va (for example, 0 V).

In the NAND string NS2 corresponding to the selective bit line BL2, while maintaining the selective memory cell MT3-2 and adjacent memory cells MT2-2 and MT4-2 adjacent thereto in on state, the non-adjacent memory cells MT0-2, MT1-2, and MT5-2 to MT7-2 which are disposed outside the adjacent memory cells MT2-2 and MT4-2 and the select gate DT-2 are in off state and the channel region 60 of the selective memory cell MT3-2 is electrically disconnected from the selective bit line BL2. In other words, the non-adjacent memory cells MT0-2, MT1-2, and MT5-2 to MT7-2 are in off state while maintaining the channel potential Vch-2 of the selective memory cell MT3-2 at the second selective potential Vb (for example, 0.5 V).

In the NAND string NS3 corresponding to the selective bit line BL3, while maintaining the selective memory cell MT3-3 and adjacent memory cells MT2-3 and MT4-3 adjacent thereto in on state, the non-adjacent memory cells MT0-3, MT1-3, and MT5-3 to MT7-3 which are disposed outside the adjacent memory cells MT2-3 and MT4-3 and the select gate DT-3 are in off state and the channel region 60 of the selective memory cell MT3-3 is electrically disconnected from the selective bit line BL3. In other words, the non-adjacent memory cells MT0-3, MT1-3, and MT5-3 to MT7-3 are in off state while maintaining the channel potential Vch-3 of the selective memory cell MT3-3 at the third selective potential Vc (for example, 1 V).

In the process illustrated in FIGS. 20A to 20D, data are written simultaneously or in parallel in the selective memory cells MT3-1, MT3-2, and MT3-3. In other words, the potential of the selective word line WL3 is set to the program potential (third potential) Vpgm (for example, 18 V) while maintaining the potential of the adjacent word lines WL2 and WL4 at the transfer potential (first potential) Vpass (for example, 10 V) and maintaining the potentials of the non-adjacent word lines WL0, WL1, and WL5 to WL7 at the second potential Vd1.

By doing this, in the NAND string NS1 corresponding to the selective bit line BL1, in the selective memory cell MT3-1, the charge is written in the charge storage region 32 from the channel region 60 through the tunnel insulating film 31 so that the data is written in the selective memory cell MT3-1. In this writing operation, the charge starts to be written into the charge storage region 32 of the selective memory cell MT3-1 by potential difference between the program potential Vpgm and the channel potential Vch-1 (=first selective potential Va (for example, 0 V)).

In the NAND string NS2 corresponding to the selective bit line BL2, in the selective memory cell MT3-2, the charge is written in the charge storage region 32 from the channel region 60 through the tunnel insulating film 31 so that the data is written in the selective memory cell MT3-2. In this writing operation, the charge starts to be written into the charge storage region 32 of the selective memory cell MT3-2 by potential difference between the program potential Vpgm and the channel potential Vch-2 (=second selective potential Vb (for example, 0.5 V)).

In the NAND string NS3 corresponding to the selective bit line BL3, in the selective memory cell MT3-3, the charge is written in the charge storage region 32 from the channel region 60 through the tunnel insulating film 31 so that the data is written in the selective memory cell MT3-3. In this writing operation, the charge starts to be written into the charge storage region 32 of the selective memory cell MT3-3 by potential difference between the program potential Vpgm and the channel potential Vch-3 (=third selective potential Vc (for example, 1 V))

In the meantime, in the NAND string NS4 corresponding to the non-selective bit line BL4, the select gate DT-4 at the drain side is in off state and the channel potential of the memory cells MT0-4 to MT7-4 becomes a potential Vch-4' which is boosted so that data is not written in the memory cell MT3-4 where the control gate 34 is connected to the selective word line WL3. Therefore, a channel of the charge (for example, electron) is not formed and the data is not written.

As described above, total four kinds of memory cells including the memory cells MT3-1, MT3-2, and MT3-3 having three kinds of writing charge quantities (or Vth) and the memory cell MT3-4 into which data is not written are implemented.

In the process illustrated in FIGS. 21A to 21D, the writing speed of data into the selective memory cells MT3-1, MT3-2, and MT3-3 is lowered in a self-limited process. That is, immediately after applying the program potential Vpgm (in the process illustrated in FIGS. 20A to 20D), with the potential difference between the channel potentials Vch-1 Vch-2, and Vch-3 of the selective memory cells MT3-1, MT3-2, MT3-3 and the program potential Vpgm of the control gate 34, the charge starts to be written in the charge storage region 32. However, as the charge (for example, electron) in the channel region 60 moves to the charge storage region 32 (the process illustrated in FIGS. 21A to 21D), the charge in the channel region 60 (for example, electron) is reduced. Therefore, the channel regions 60 of the selective memory cells MT3-1, MT3-2, and MT3-3 are depleted and the channel potentials Vch-1, Vch-2, and Vch-3 of the selective memory cells MT3-1, MT3-2, and MT3-3 are raised.

Here, in the NAND string NS1 corresponding to the selective bit line BL1, even though the charge is supplied from the channel regions 60 of the adjacent memory cells MT2-1 and MT4-1 to the channel region 60 of the selective memory cell MT3-1, the charge is hardly supplied from the channel regions 60 of the non-adjacent memory cells MT0-1, MT1-1, and MT5-1 to MT7-1. Therefore, the quantity of charges which may be supplied to the channel region 60 of the selective memory cell MT3-1 may be limited to an appropriate amount corresponding to a threshold level to be set in the selective memory cell MT3-1. Accordingly, it is possible to rapidly lower the writing speed of data into the selective memory cell MT3-1 in accordance with the threshold level to be set in the selective memory cell MT3-1 in a self-limited process.

In the NAND string NS2 corresponding to the selective bit line BL2, even though the charge is supplied from the channel regions 60 of the adjacent memory cells MT2-2 and MT4-2 to the channel region 60 of the selective memory cell MT3-2, the charge is hardly supplied from the channel regions 60 of the non-adjacent memory cells MT0-2, MT1-2, and MT5-2 to MT7-2. Therefore, the quantity of charges which may be supplied to the channel region 60 of the selective memory cell MT3-2 may be limited to an appropriate amount corresponding to a threshold level to be set in the selective memory cell MT3-2. Accordingly, it is possible to rapidly lower the writing speed of data into the selective memory cell MT3-2 in accordance with the threshold level to be set in the selective memory cell MT3-2 in a self-limited process.

In the NAND string NS3 corresponding to the selective bit line BL3, even though the charge is supplied from the channel regions 60 of the adjacent memory cells MT2-3 and MT4-3 to the channel region 60 of the selective memory cell MT3-3, the charge is hardly supplied from the channel region 60 of the non-adjacent memory cells MT0-3, MT1-3, and MT5-3 to MT7-3. Therefore, the quantity of charges which may be supplied in the channel region 60 of the selective memory cell MT3-3 may be limited to an appropriate amount corresponding to a threshold level to be set in the selective memory cell MT3-3. Accordingly, it is possible to rapidly lower the writing speed of data into the selective memory cell MT3-3 in accordance with the threshold level to be set in the selective memory cell MT3-3 in a self-limited process.

As described above, in the third embodiment, the potential of all of the plurality of word lines WL0 to WL7 is set to the transfer potential (first potential) Vpass in the first bit line potential setting state and then in the second bit line potential setting state. In the first bit line potential setting state, the selective bit line BL1 corresponding to the selective memory cell MT3-1 among the plurality of bit lines BL1 to BL4 has the selective potential Vss, the potential of the selective bit line BL2 corresponding to the selective memory cell MT3-2 becomes the selective potential Vss, the potential of the selective bit line BL3 corresponding to the selective memory cell MT3-3 becomes the selective potential Vss, and the potential of the non-selective bit line BL4 becomes the non-selective potential Vdd. In the second bit line potential setting state, the potential of the selective bit line BL1 is set to the first selective potential Va, the potential of the selective bit line BL2 is set to the second selective potential Vb, the potential of the selective bit line BL3 is set to the third selective potential Vc, and the potential of the non-selective bit line BL4 is set to the non-selective potential Vdd. The potential of the non-adjacent word lines WL0, WL1, and WL5 to WL7 is set to the second potential Vd1 in the second bit line potential setting state. Further, the potential of the selective word line WL3 is set to the program potential (third potential) Vpgm in the second bit line potential setting state. Accordingly, multiple values of data having different levels are written simultaneously or in parallel in the selective memory cells MT3-1, MT3-2, and MT3-3. In other words, multiple values may be efficiently written in the plurality of memory cells while suppressing the overwriting.

Figure 19A:
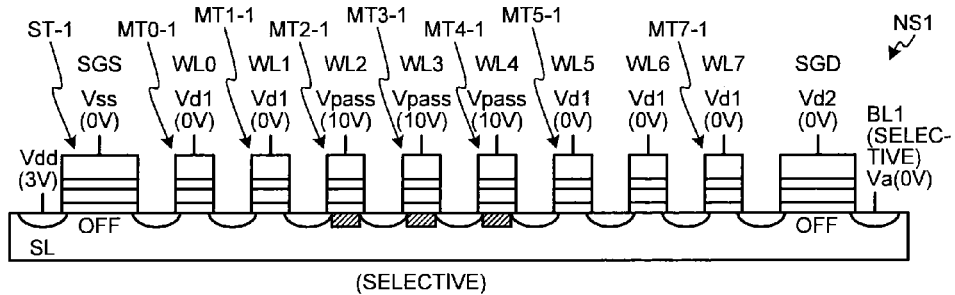
FIGS. 19A to 19D are views illustrating an operation of the memory cell array according to the third embodiment.
Figure 19B:
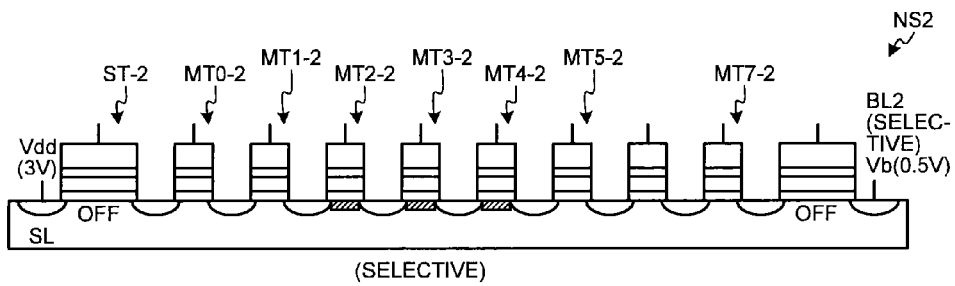
Figure 19C:
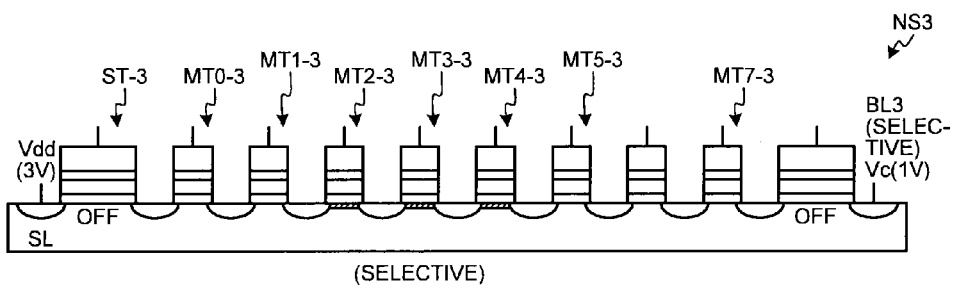
Figure 19D:
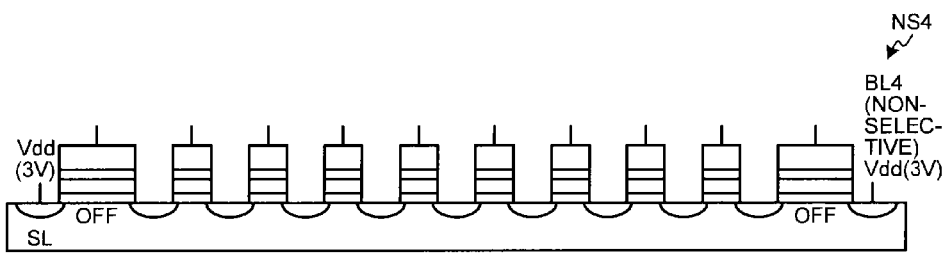
Figure 20A:
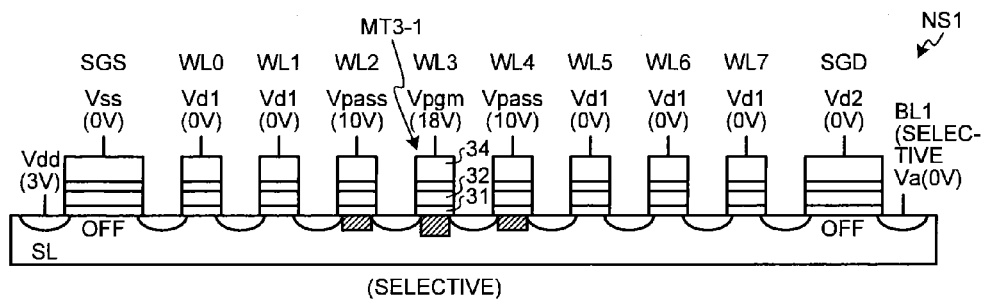
FIGS. 20A to 20D are views illustrating an operation of the memory cell array according to the third embodiment.
Figure 20B:
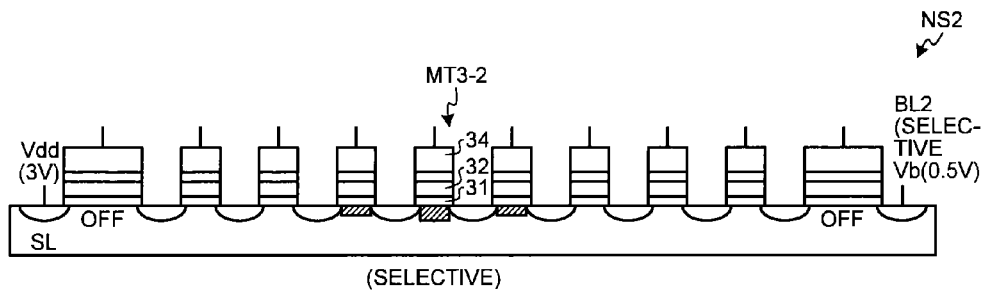
Figure 20C:
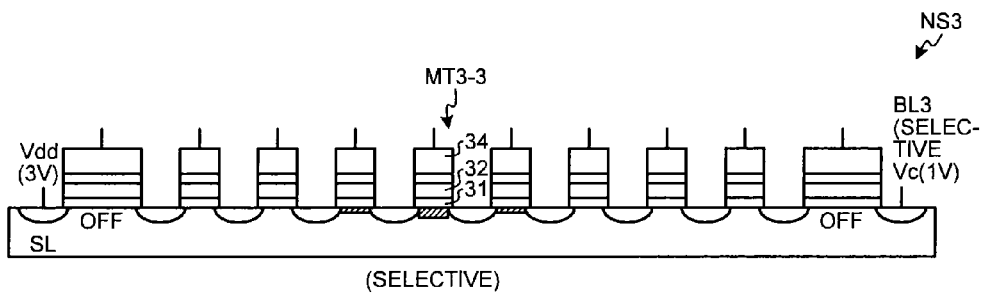
Figure 20D:
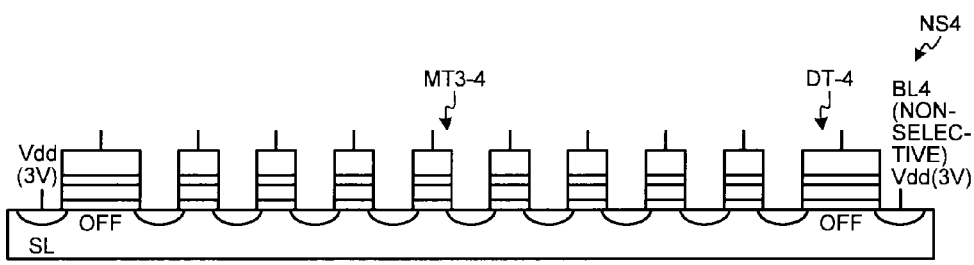
Figure 21A:
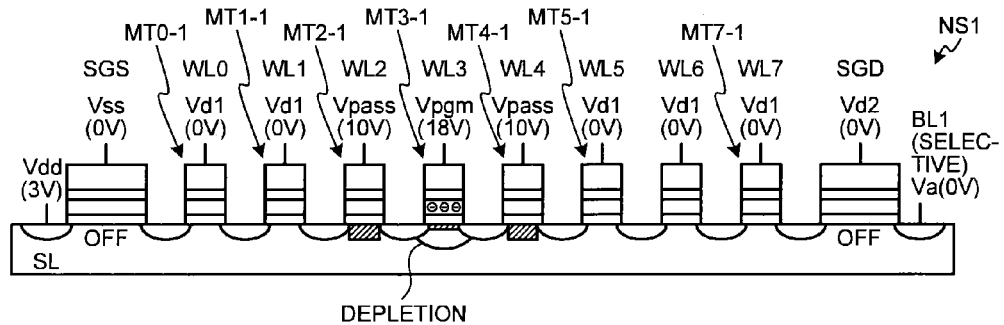
FIGS. 21A to 21D are views illustrating an operation of the memory cell array according to the third embodiment.
Figure 21B:
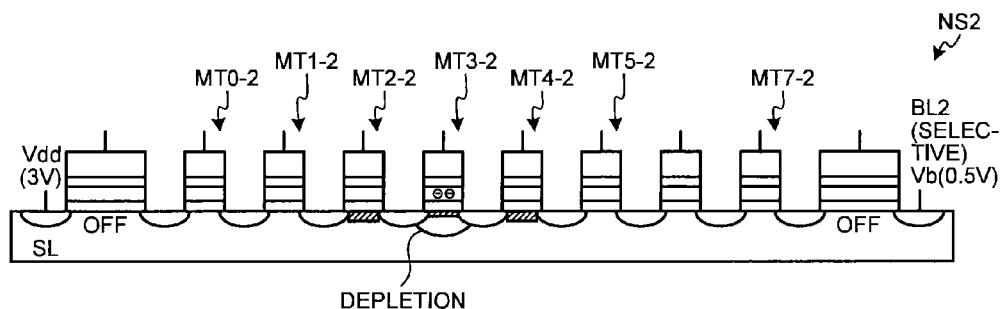
Figure 21C:
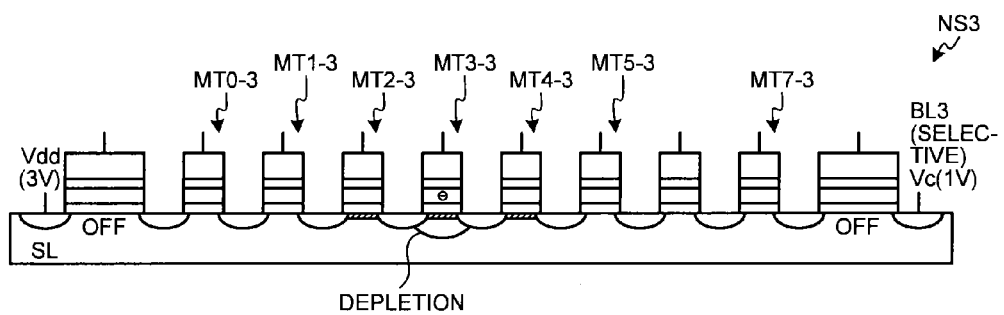
Figure 21D:
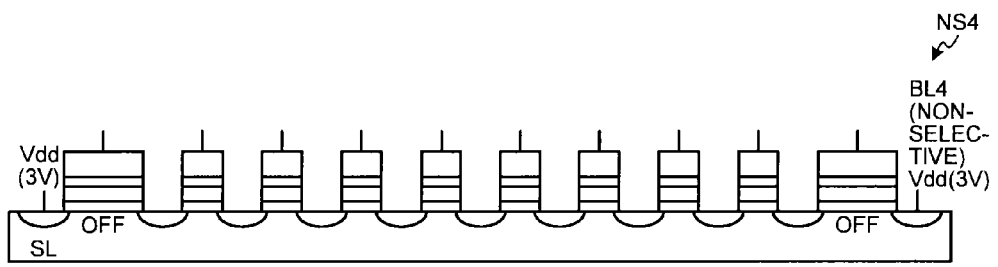

It should be noted that the electrical disconnection of the channel regions 60 of the selective memory cells MT3-1, MT3-2, and MT3-3 from the selective bit lines BL1, BL2, and BL3, and writing of data in the selective memory cells MT3-1, MT3-2, and MT3-3 may be performed simultaneously or in parallel. For example, the operation illustrated in FIGS. 19A to 19C and the operation illustrated in FIGS. 20A to 20C may be performed simultaneously or in parallel. In other words, the potential of the selective word line WL3 may be set to the program potential (third potential) Vpgm (for example, 18 V) as illustrated in FIGS. 20A to 20C while setting the potential of non-adjacent word lines WL0, WL1, and WL5 to WL7 to the second potential Vd1 (for example, 0 V) as illustrated in FIGS. 19A to 19C.

Alternatively, in the third embodiment, instead of writing different ternaries simultaneously or in parallel, different binaries may be written simultaneously or in parallel and different quaternaries may be written simultaneously or in parallel. Otherwise, the number of bit lines for every block is 5 or more and the method of the third embodiment is applied so as to control to write different multiple values of 5 or higher simultaneously or in parallel.

Alternatively, the second embodiment may be combined with the third embodiment. For example, the third embodiment may be changed such that the memory cell does not have the source region 40 and the drain region 50 and a process corresponding to the process illustrated in FIGS. 16A to 16C, that is, a process that supplements the charge (for example, electron) from the channel regions 60 of the adjacent memory cells in the channel region 60 of the selective memory cell may be added. Also in this case, it is possible to efficiently write multiple values into the plurality of memory cells while suppressing the overwriting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A writing method of a nonvolatile semiconductor memory device including a plurality of strings, a plurality of bit lines, and a plurality of word lines, in each of the plurality of strings a plurality of memory cells being connected in series, the plurality of bit lines being connected to the plurality of strings, and the plurality of word lines intersecting the plurality of strings to be connected to control gates of the memory cells, the method comprising:

setting potentials of the plurality of word lines to a first potential in a bit line potential setting state, the first potential being a potential to allow the memory cells corresponding to a selective bit line to be in on state, the selective bit line being a bit line corresponding to a selective memory cell among the plurality of bit lines, the bit line potential setting state being a state where a potential of the selective bit line is set to a selective potential and where a potential of a non-selective bit line is set to a non-selective potential; and setting potentials of non-adjacent word lines to a second potential while maintaining potentials of adjacent word lines at a potential which allows the memory cells corresponding to the selective bit line to be in on state and setting a potential of a selective word line to a third potential in the bit line potential setting state, the selective word line being a word line corresponding to the selective memory cell among the plurality of word lines, the adjacent word lines being word lines which are adjacent at both sides of the selective word line among the plurality of word lines, the non-adjacent word lines being word lines which are disposed outside the adjacent word lines among the plurality of word lines, the second potential being a potential which is determined so as to allow the memory cells corresponding to the selective bit line to be in off state, the third potential being a potential where data is written in the selective memory cell corresponding to the selective bit line.

2. The writing method of a nonvolatile semiconductor memory device according to claim 1, wherein
the adjacent word lines are word lines such that one word line is adjacent at each side of the selective word line.

3. The writing method of a nonvolatile semiconductor memory device according to claim 1, wherein
the adjacent word lines are word lines such that a plurality of word lines are adjacent at each side of the selective word line.

4. The writing method of a nonvolatile semiconductor memory device according to claim 1, wherein
when there is no word line which is adjacent at one side of the selective word line, a word line which is adjacent at the other side of the selective word line is used as an adjacent word line to maintain a potential of the adjacent word line at a potential which allows the memory cells corresponding to the selective bit line to be in on state.

5. The writing method of a nonvolatile semiconductor memory device according to claim 1, wherein
a potential difference between the third potential and the selective potential is larger than a potential difference between the first potential and the selective potential.

6. The writing method of a nonvolatile semiconductor memory device according to claim 1, wherein
the potentials of the adjacent word lines are set to a fourth potential between the first potential and the second potential, as a potential which allows the memory cells corresponding to the selective bit line to be in on state in the bit line potential setting state.

7. The writing method of a nonvolatile semiconductor memory device according to claim 6, wherein
a potential difference between the fourth potential and the selective potential is smaller than a potential difference between the first potential and the selective potential.

8. The writing method of a nonvolatile semiconductor memory device according to claim 6, wherein
the fourth potential is equivalent to the non-selective potential.

9. The writing method of a nonvolatile semiconductor memory device according to claim 6, wherein
each of the plurality of memory cells in each of the plurality of strings does not have a source region and a drain region.

10. The writing method of a nonvolatile semiconductor memory device according to claim 1, wherein
the setting the potentials of the non-adjacent word lines to the second potential is performed in a state where the potential of the selective word line and the potentials of the adjacent word lines are maintained at a potential which allows the memory cells corresponding to the selective bit line to be in on state, and
after the setting the potentials of the non-adjacent word lines to the second potential, the setting the potential of the selective word line to the third potential is performed while maintaining the potentials of the adjacent word lines at the potential which allows the memory cells corresponding to the selective bit line to be in on state.

11. The writing method of a nonvolatile semiconductor memory device according to claim 1, wherein
the setting the potentials of the non-adjacent word lines to the second potential is performed in a state where the potential of the selective word line and the potentials of the adjacent word lines are respectively set to the first potential, and
after the setting the potentials of the non-adjacent word lines to the second potential, the setting the potential of the selective word line to the third potential is performed while maintaining the potentials of the adjacent word lines at the first potential.

12. The writing method of a nonvolatile semiconductor memory device according to claim 1, wherein
the setting the potentials of the non-adjacent word lines to the second potential is performed in a state where the potential of the selective word line and the potentials of the adjacent word lines are respectively set to the first potential, and
after the setting the potentials of the non-adjacent word lines to the second potential, the setting the potential of the selective word line to the third potential and setting the potentials of the adjacent word lines at a fourth potential which is between the first potential and the second potential are performed.

13. The writing method of a nonvolatile semiconductor memory device according to claim 1, wherein
the setting the potentials of the plurality of word lines to the first potential is performed in a first bit line potential setting state where among the plurality of bit lines, a potential of a first selective bit line corresponding to a first selective memory cell and a second selective bit line corresponding to a second selective memory cell are the selective potential and the potential of the non-selective bit line is the non-selective potential, and
after the setting the potentials of the plurality of word lines to the first potential, the setting the potentials of the non-adjacent word lines to the second potential and the setting the potential of the selective word line to the third potential are performed in a second bit line potential setting state where a potential of the first selective bit line is a first selective potential, a potential of the second selective bit line is a second selective potential different from the first selective potential, and the potential of the non-selective bit line is the non-selective potential.

14. The writing method of a nonvolatile semiconductor memory device according to claim 13, wherein
the setting the potential of the selective word line to the third potential includes writing multiple valued data in the first selective memory cell and the second selective memory cell in parallel.

15. The writing method of a nonvolatile semiconductor memory device according to claim 14, wherein
a potential difference between the first selective potential and the non-selective potential is larger than a potential difference between the second selective potential and the non-selective potential, and
a threshold level corresponding to written data of the first selective memory cell is larger a threshold level corresponding to written data in the second selective memory cell.

16. The writing method of a nonvolatile semiconductor memory device according to claim 1,
the method further comprising setting a potential of a select gate line commonly connected to a plurality of select gates provided on bit line sides of the plurality of strings, respectively,
wherein the setting the potential of the select gate line includes:

setting the potential of the select gate line to a potential that allows a select gate corresponding to the selective bit line to be in on state when the setting the potentials of the plurality of word lines to the first potential is performed, and setting the potential of the select gate line to a potential that allows the select gate corresponding to the selective bit line to be in off state when the setting the potentials of the non-adjacent word lines to the second potential and the setting the potential of the selective word line to the third potential are performed.

17. The writing method of a nonvolatile semiconductor memory device according to claim 16, wherein the setting the potential of the select gate line includes setting the potential of the select gate line to a potential that allows a select gate corresponding to the selective bit line to be in on state and that allows the select gate corresponding to the non-selective bit line to be in off state, when the setting the potentials of the plurality of word lines to the first potential is performed.

18. The writing method of a nonvolatile semiconductor memory device according to claim 16, wherein the potential of the select gate line to be set when the setting the potentials of the plurality of word lines to the first potential is performed is equivalent to the non-selective potential.

19. The writing method of a nonvolatile semiconductor memory device according to claim 16, wherein the potential of the select gate line to be set when the setting the potentials of the non-adjacent word lines to the second potential and the setting the potential of the selective word line to the third potential are performed is equivalent to the selective potential.

20. The writing method of a nonvolatile semiconductor memory device according to claim 17, wherein the setting the potentials of the plurality of word lines to the first potential includes setting the potentials of the plurality of word lines to a potential where the memory cells corresponding to the selective bit line to be in on state and where channel potentials of memory cells corresponding to the non-selective bit line are boosted so that the data is not written in a memory cell in which a control gate thereof is connected to the selective word line and which corresponds to the non-selective bit line when the setting the potential of the selective word line to the third potential is performed.

* * * * *